United States Patent
Li et al.

(10) Patent No.: US 11,934,916 B2
(45) Date of Patent: Mar. 19, 2024

(54) ELECTRONIC DEVICE AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jiun-Yun Li, Taipei (TW); Shih-Yuan Chen, Taipei (TW); Yao-Chun Chang, Taipei (TW); Ian Huang, Taipei (TW); Chiung-Yu Chen, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 208 days.

(21) Appl. No.: 17/370,691

(22) Filed: Jul. 8, 2021

(65) Prior Publication Data

US 2022/0309372 A1     Sep. 29, 2022

Related U.S. Application Data

(60) Provisional application No. 63/166,089, filed on Mar. 25, 2021.

(51) Int. Cl.
*G06N 10/00*     (2022.01)
*B82Y 10/00*     (2011.01)
(Continued)

(52) U.S. Cl.
CPC .............. *G06N 10/00* (2019.01); *H10N 60/01* (2023.02); *H10N 60/80* (2023.02); *B82Y 10/00* (2013.01)

(58) Field of Classification Search
CPC ........ G06N 10/00; G06N 10/40; B82Y 10/00; H01L 29/423; H01L 29/66977
See application file for complete search history.

(56) References Cited

U.S. PATENT DOCUMENTS

| 8,507,894 B2 | 8/2013 | Morello et al. |
| 2015/0171197 A1 | 6/2015 | Taylor |
(Continued)

FOREIGN PATENT DOCUMENTS

WO    WO 2018/004634 A1    1/2018

OTHER PUBLICATIONS

Dehollain et al., "Nanoscale broadband transmission lines for spin qubit control", CQC2T/UNSW, Nanotechnology, vol. 24, 2012, total 11 pages.

*Primary Examiner* — Matthew L Reames
(74) *Attorney, Agent, or Firm* — Birch, Stewart, Kolasch & Birch, LLP

(57) ABSTRACT

An electronic device includes a pair of depletion gates, an accumulation gate, and a conductive resonator. The depletion gates are spaced apart from each other. The accumulation gate is over the depletion gates. The conductive resonator is over the depletion gates and the accumulation gate. The conductive resonator includes a first portion, a second portion, and a third portion. The first portion and the second portion are on opposite sides of the accumulation gate. The third portion interconnects the first and second portions of the conductive resonator and across the depletion gates. A bottom surface of the first portion of the conductive resonator is lower than a bottom surface of the accumulation gate.

20 Claims, 26 Drawing Sheets

(51) Int. Cl.
 *H10N 60/01* (2023.01)
 *H10N 60/80* (2023.01)

(56) References Cited

U.S. PATENT DOCUMENTS

| | | |
|---|---|---|
| 2015/0279981 A1 | 10/2015 | Eriksson et al. |
| 2021/0020821 A1 | 1/2021 | Nayfeh et al. |
| 2021/0028345 A1 | 1/2021 | Hart et al. |
| 2021/0066570 A1 | 3/2021 | Luethi et al. |
| 2023/0136676 A1* | 5/2023 | Yeh .................. G06N 10/00 257/39 |

* cited by examiner

200

200

ELECTRONIC DEVICE AND MANUFACTURING METHOD THEREOF

PRIORITY CLAIM AND CROSS-REFERENCE

This application claims priority to U.S. Provisional Application Ser. No. 63/166,089, filed Mar. 25, 2021, which is herein incorporated by reference.

BACKGROUND

Quantum computing refers to the field of research related to computation systems that use quantum mechanical phenomena to manipulate data. On the roadmap towards building a scalable, silicon-based quantum computer, several milestones have already been achieved. Quantum computing may involve initializing states of N qubits (quantum bits), creating controlled entanglements among them, allowing these states to evolve, and reading out the states of the qubits after the evolution. A qubit is may be a system having two degenerate (i.e., of equal energy) quantum states, with a non-zero probability of being found in either state. Thus, N qubits can define an initial state that is a combination of $2^N$ classical states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
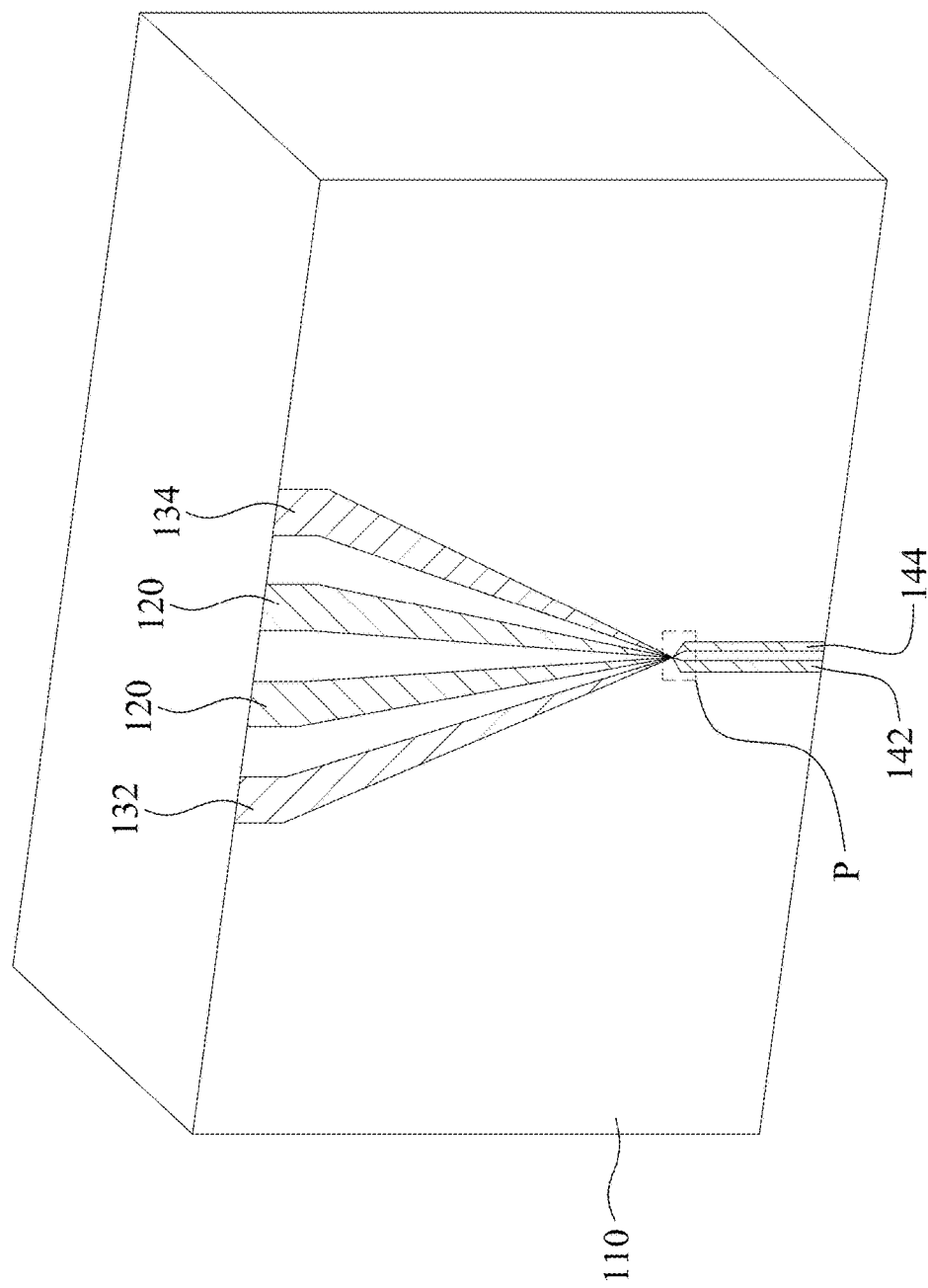
FIG. 1A is a perspective view of an electronic device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of the present disclosure provide an electronic device having a resonator adjacent to sidewalls of an accumulation gate of the electronic device to implement a qubit with high efficiency. The qubit is configured for the control and readout of an electron or hole spin of a single dopant in a (semiconductor) substrate. In some embodiments, a transistor used in the qubit may be realized on the device selected from the group including planar devices, multi-gate devices, FinFETs, nanosheet-gate FETs, and gate-all-around FETs.

Figure 1B:
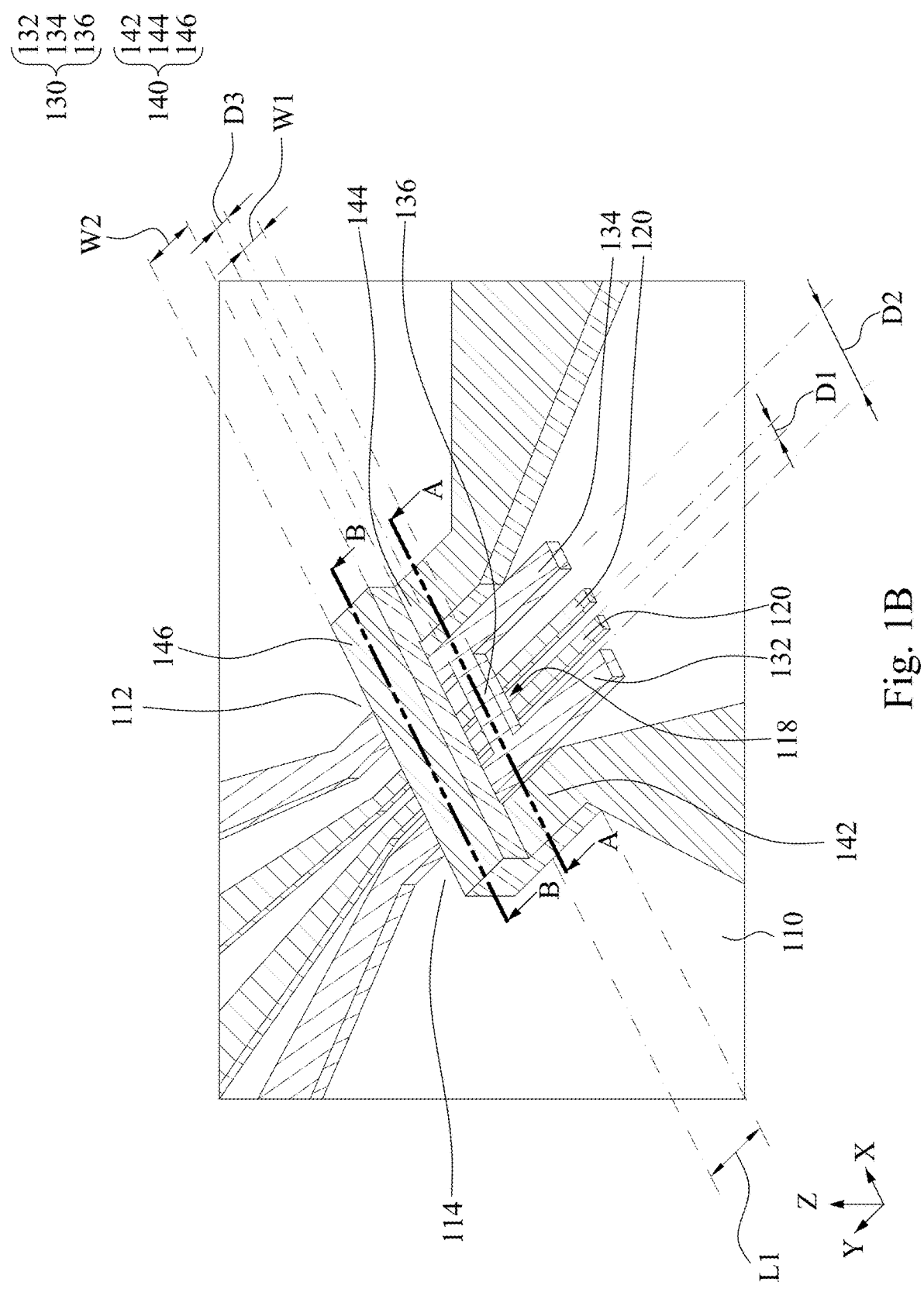
FIG. 1B is an enlarged perspective view of area P in FIG. 1A in accordance with some embodiments of the present disclosure.
Figure 2A:
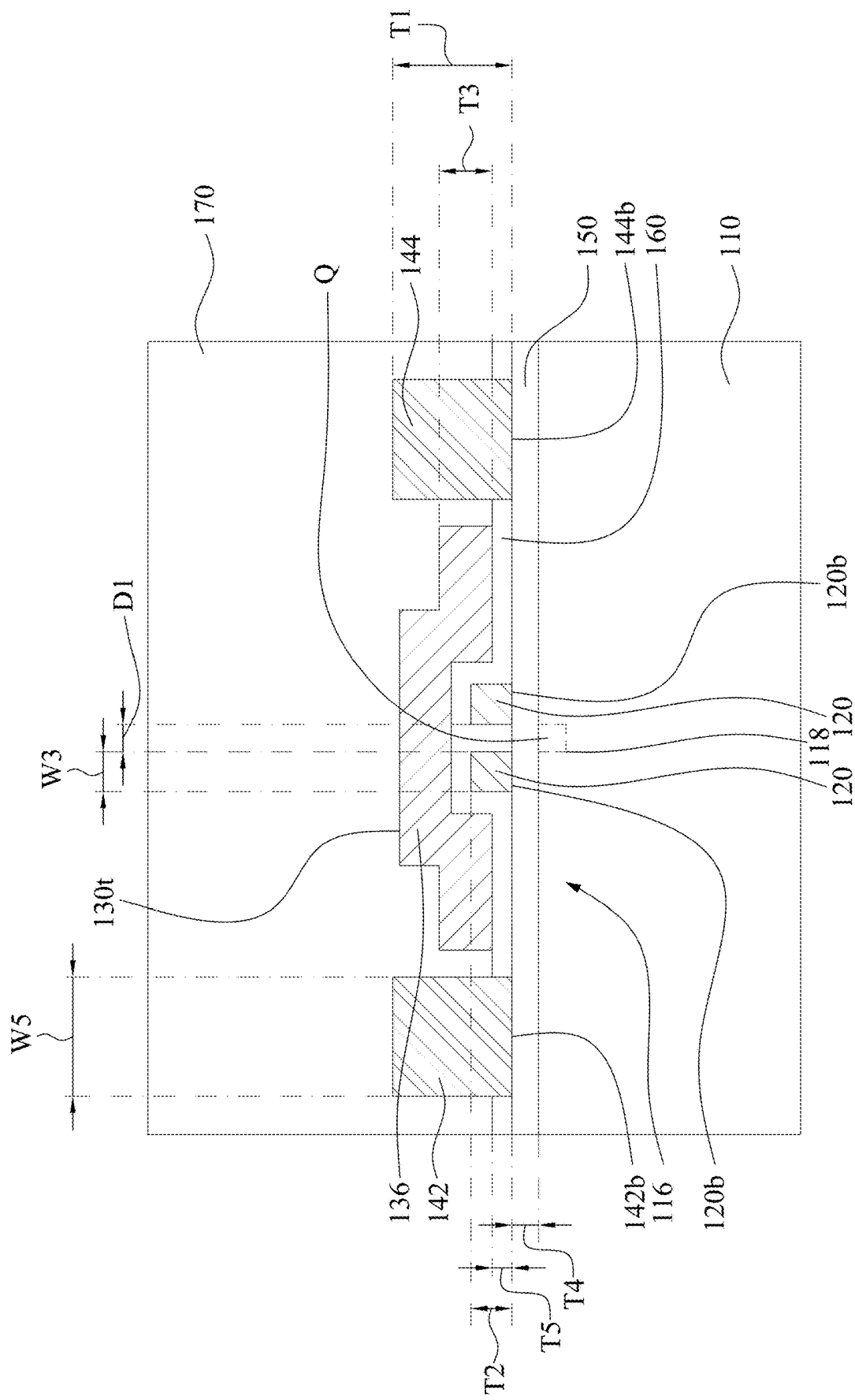
FIG. 2A is a cross-sectional view taken along line A-A in FIG. 1B.
Figure 2B:
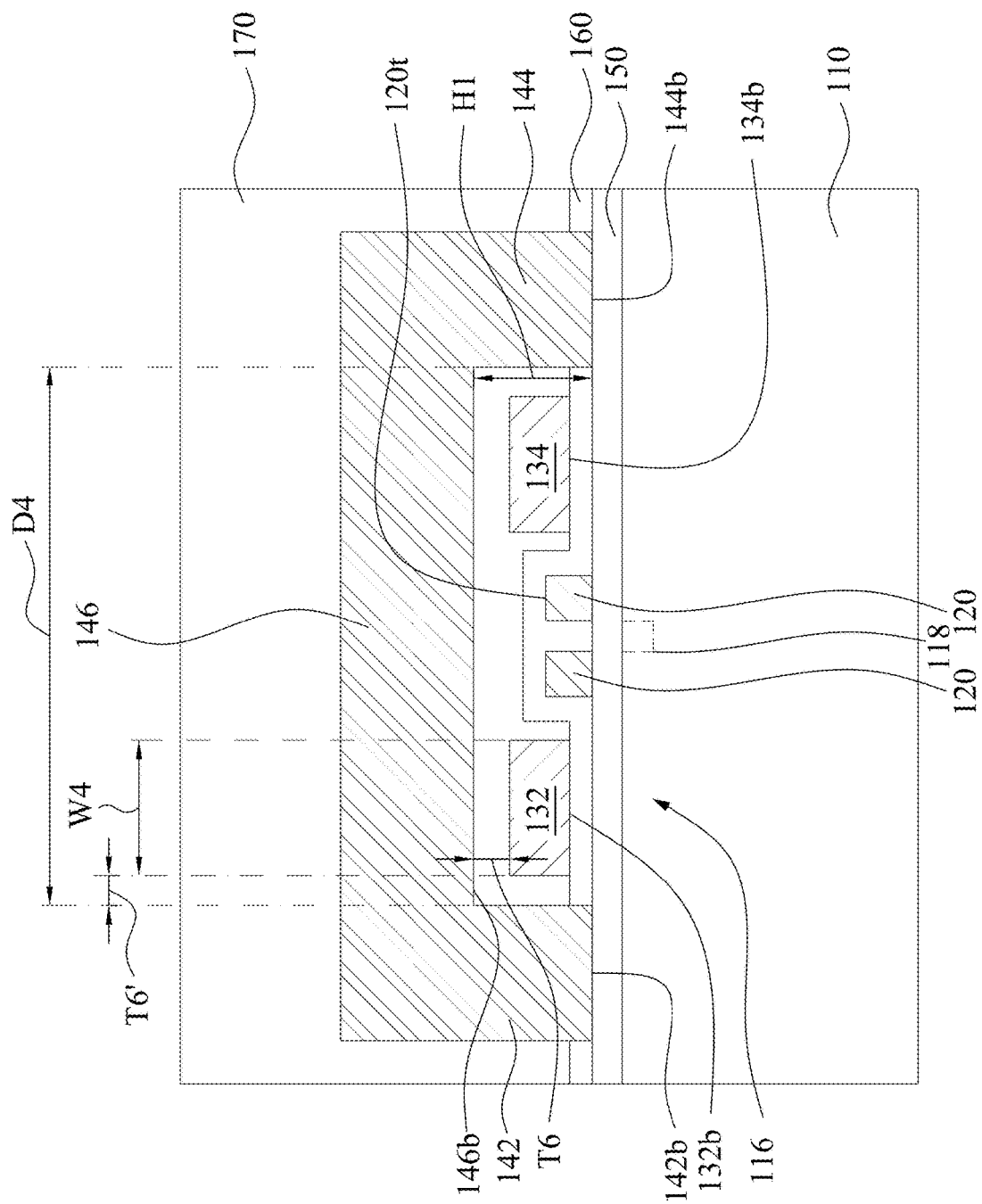
FIG. 2B is a cross-sectional view taken along line B-B in FIG. 1B.

FIG. 1A is a perspective view of an electronic device 100 in accordance with some embodiments of the present disclosure, FIG. 1B is an enlarged perspective view of area P in FIG. 1A in accordance with some embodiments of the present disclosure, FIG. 2A is a cross-sectional view taken along line A-A in FIG. 1B, and FIG. 2B is a cross-sectional view taken along line B-B in FIG. 1B. In addition to the electronic device 100, FIG. 1B depicts X-axis, Y-axis, and Z-axis directions. For clarity, dielectric layers for isolating conductive elements of the electronic device 100 are omitted in FIGS. 1A and 1B, and the dielectric layers are shown in FIGS. 2A and 2B. The electronic device 100 includes a substrate 110, depletion gates 120, an accumulation gate 130, and a conductive resonator 140. The electronic device 100 further includes an active region 116, a source region 112, and a drain region 114 in the substrate 110. The active region 116 is not shown in FIGS. 1A and 1B but is shown in FIGS. 2A and 2B.

Reference is made to FIGS. 1A and 1B. The depletion gates 120 are above the substrate 110 and are spaced apart from each other. That is, the source region 112 and the drain region 114 in the substrate 110 are under the depletion gates 120. The depletion gates 120 define a tunnel barrier 118 in the substrate 110. A (minimum) distance D1 between the depletion gates 120 may be in a range of about 5 nm to about 50 nm. If the distance D1 is less than about 5 nm, quantum dot may not be formed in the active region 116 of the electronic device 100 and between the depletion gates 120. If the distance D1 is greater than about 50 nm, more than one charge (quantum dot) may be formed in the active region 116 and between the depletion gates 120.

The accumulation gate 130 is over and is spaced apart from the depletion gates 120. That is, the depletion gates 120 are isolated from the accumulation gate 130. The accumulation gate 130 includes a first portion 132, a second portion 134, and a third portion 136 interconnecting the first portion 132 and the second portion 134. The first portion 132 and the second portion 134 are on opposite sides of the depletion gates 120. The first portion 132 is spaced apart from the second portion 134 by a distance D2, and the third portion 136 is between the first portion 132 and the second portion 134. In some embodiments, the first portion 132, the second portion 134, and the third portion 136 are integrally formed. That is, there is no interface between the first portion 132 and the third portion 136 and between the second portion 134 and the third portion 136. The first portion 132 and the second portion 134 do not overlap with the depletion gates 120, and the third portion 136 is across the depletion gates 120.

The conductive resonator 140 is over the depletion gates 120 and the accumulation gate 130 and includes a first portion 142, a second portion 144, and a third potion 146 interconnecting the first portion 142 and the second portion 144. In some embodiments, the first portion 142, the second portion 144, and the third potion 146 of the conductive resonator 140 form a U shape as shown in FIG. 1B. The first portion 142 and the second portion 144 of the conductive resonator 140 are on opposite sides of the accumulation gate 130 and on opposite sides of the depletion gates 120. The first portion 132 of the accumulation gate 130 is between the depletion gates 120 and the first portion 142 of the conductive resonator 140, and the second portion 134 of the accumulation gate 130 is between the depletion gates 120 and the second portion 144 of the conductive resonator 140. That is, the first portion 142 and the second portion 144 of the conductive resonator 140 do not overlap with the depletion gates 120 and the accumulation gate 130. In some embodiments, the first portion 132 of the accumulation gate 130 is closer to the first portion 142 of the conductive resonator 140 than to the depletion gates 120, and/or the second portion 134 of the accumulation gate 130 is closer to the second portion 144 of the conductive resonator 140 than to the depletion gates 120. Further, the third portion 146 of the conductive resonator 140 is across the depletion gates 120 and the first portion 132 and the second portion 134 of the accumulation gate 130 but is shifted (or offset) from the third portion 136 of the accumulation gate 130 by a distance D3. That is, the third portion 146 of the conductive resonator 140 does not overlap with (or is spaced apart from) the third portion 136 of the accumulation gate 130. In some embodiments, the distance D3 between the third portion 146 and the third portion 136 is greater than a width W1 of the third portion 136 and less than a length L1 of the first portion 142 (or the second portion 144). Further, the third portion 146 of the conductive resonator 140 is between the source region 112 (or the drain region 114) and the second portion 144 (or the first portion 142) of the conductive resonator 140.

In some embodiments, the depletion gates 120, the first portion 132 and the second portion 134 of the accumulation gate 130, and the first portion 142 and the second portion 144 of the conductive resonator 140 extend in a first direction (e.g., a Y direction), and the third portion 132 of the accumulation gate 130 and the third portion 142 of the conductive resonator 140 extend in a second direction (e.g., a X direction) substantially perpendicular to the first direction.

Figure 3:
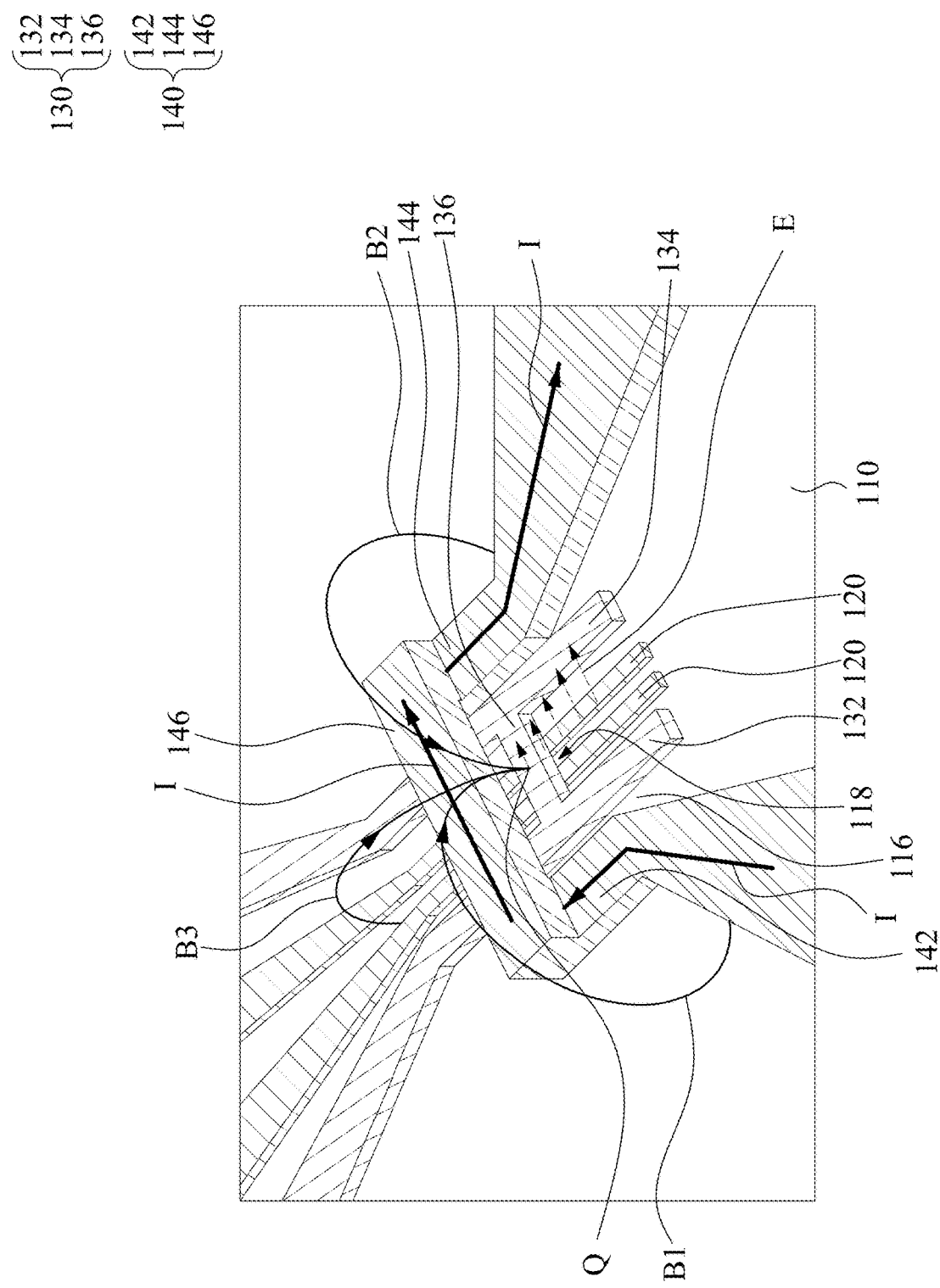
FIG. 3 is a schematic diagram of the electronic device during operating in accordance with some embodiments of the present disclosure.

FIG. 3 is a schematic diagram of the electronic device 100 during operating in accordance with some embodiments of the present disclosure. Reference is made to FIGS. 2A, 2B, and 3. When the electronic device 100 is operating, the accumulation gate 130 creates a gate-induced charge layer in the active region 116. Subsequently, the depletion gates 120 form a tunnel barrier 118 that interrupts the gate-induced charge layer with a single dopant implanted in the active region 116 located under the depletion gates 120. The depletion gates 120 also have the function of bringing the dopant level in resonance with the Fermi level of the leads. In the presence of a magnetic field, the Zeeman-split dopant states can also be resolved. By applying a source-drain bias and tuning the dopant level at resonance with the Fermi energies of the gate-induced charge layer, a sharp conductivity peak is expected to be observed. By inducing a Zeeman splitting of the electron or hole spin states with an external magnetic field, a spin-dependent tunneling may be observed. Because of charging effects, the resonant charge tunneling is sequential, that is, only one charge at a time can traverse the barrier by passing through the dopant level. The coherent manipulation of the quantum state of a spin qubit may be achieved by the application of magnetic fields, with a frequency matching the Zeeman splitting of the spin states. In some embodiments, the magnetic field oscillates at microwave frequency to excite spin resonance of a single electron (dopant), i.e., electron spin resonance (ESR).

The magnetic field may be strong to allow fast oscillation (or rotation) of spin states. Meanwhile, the electric field may be weak or absent in the tunnel barrier 118 to guarantee the proper operation of electronic devices 100. Specifically, the electric fields may lead to some effects, such as photon-assisted tunneling, disrupt the operation of the electronic device, and contribute to local heating of the electronic device. The embodiments of the present disclosure solve issues in existing approaches by providing an improved structure to create strong magnetic fields and weak or negligible electric fields at the tunnel barrier 118.

Specifically, as shown in FIG. 3, since the first portion 142, the second portion 144, and the third portion 146 of the conductive resonator 140 surround a qubit location Q (i.e., an intersection area of the tunnel barrier 118 and the third portion 136 of the accumulation gate 130) of the electronic device 100, the conductive resonator 140 can create strong magnetic fields (i.e., the sum of magnetic fields B1, B2, and B3) at the qubit location Q. In some embodiments, the total magnetic field of the electronic device 100 is greater than about 8 mT at about 10 GHz to about 50 GHz with 0 dBm input power.

Moreover, as shown in FIG. 3, the intensity of the electric field E is reduced at the qubit location Q. The first portion 142 and the second portion 144 of the conductive resonator 140 are configured to reduce the intensity of the electric field E at the qubit location. The first portion 132 and the second portion 134 of the accumulation gate 130 also provide good shielding effect for reducing the intensity of the electric field E at the qubit location Q. In some embodiments, a ratio of the total magnetic field to the electric field of the electronic device 100 is greater than 10E2 mT*m/MV at about 10 GHz to about 50 GHz with 0 dBm input power. With such high magnetic field, the electronic device 100 has quick operational speed.

Reference is made to FIGS. 1B and 3. In some embodiments, the third portion 146 of the conductive resonator 140 has a width W2 in a range of about 100 nm to about 500 nm. If the width W2 is less than about 100 nm, the magnetic field B3 may be reduced due to a large angle between the current I of the conductive resonator 140 and the quantum dot. If the width W2 is greater than about 500 nm, the magnetic field B3 may be reduced due to a long distance between the current I of the conductive resonator 140 and the quantum dot. With such high ratio, the electronic device 100 has low noise environment.

Reference is made to FIGS. 2A and 2B. In some embodiments, each of the depletion gates 120 has a width W3 in a range of about 5 nm to about 50 nm. In some embodiments, each of the first portion 132 and the second portion 134 of the accumulation gate 130 has a width W4 in a range of about 5 nm to about 50 nm. In some embodiments, the width W4 is greater than the width W3 for providing good shielding against the electric field E. Further, each of the first portion 142 and the second portion 144 of the conductive resonator 140 has a width W5 in a range of about 50 nm to about 500 nm. In some embodiments, the width W5 is greater than the width W4 of the first portion 132 and second portion 134 (and/or the width W3 of the depletion gate 120) for providing good shielding against the electric field E.

In some embodiments, each of the first portion 142 and the second portion 144 of the conductive resonator 140 has a thickness T1 in a range of about 100 nm to about 500 nm. If the thickness T1 is less than about 100 nm, the magnetic fields B1 and B2 may be reduced because the current I of the conductive resonator 140 may flow into the conductive resonator 140. If the thickness T1 is greater than about 500 nm, the magnetic field B3 may be reduced due to a long distance between the current I of the conductive resonator 140 and the quantum dot. When the thickness T1 is in a range of about 100 nm to about 500 nm, the conductive resonator 140 has small return loss.

In some embodiments, each of the depletion gates 120 has a thickness T2 in a range of about 1 nm to about 50 nm. In some embodiments, the accumulation gate 130 has a thickness T3 in a range of about 1 nm to about 50 nm. In some embodiments, the thickness T1 is greater than the thickness T3, and/or the thickness T3 is greater than the thickness T2. As shown in FIGS. 2A and 2B, bottom surfaces 142b and 144b of the first portion 142 and the second portion 144 of the conductive resonator 140 are lower than bottom surfaces 132b and 134b of the first portion 132 and the second portion 134 of the accumulation gate 130. In some embodiments, the bottom surfaces 142b and 144b are bottommost surfaces of the conductive resonator 140, and the bottom surfaces 132b and 134b are bottommost surfaces of the accumulation gate 130.

Further, bottom surfaces 132b and 134b of the first portion 132 and the second portion 134 of the accumulation gate 130 are lower than top surfaces 120t of the depletion gates 120. The bottom surfaces 142b and 144b of the first portion 142 and the second portion 144 of the conductive resonator 140 are substantially coplanar with bottom surfaces 120b of the depletion gates 120 and are lower than a top surface 130t of the accumulation gate 130.

In some embodiments, a dielectric layer 150 between the depletion gates 120 and the substrate 110 has a thickness T4 in a range of about 1 nm to about 20 nm. In some embodiments, a dielectric layer 160 between the depletion gates 120 and the accumulation gate 130 has a thickness T5 in a range of about 1 nm to about 20 nm. In some embodiments, a portion of a dielectric layer 170 between the third portion 146 of the conductive resonator 140 and the first portion 132 (the second portion 134) of the accumulation gate 130 has a thickness T6 in a range of about 5 nm to about 50 nm. In some embodiments, a portion of a dielectric layer 170 between the first portion 142 (or the second portion 144) of the conductive resonator 140 and the first portion 132 (or the second portion 134) of the accumulation gate 130 has a thickness T6' in a range of about 5 nm to about 50 nm. In some embodiments, the thickness T6 is different from the thickness T6'. In some other embodiments, the thicknesses T6 and T6' have the same value.

Reference is made to FIGS. 2B and 3. In some embodiments, a distance D4 between the first portion 142 and the second portion 144 of the conductive resonator 140 is in a range of about 45 nm to about 600 nm. If the distance D4 is greater than about 600 nm, the magnetic fields B1, B2, and B3 are reduced. If the distance D4 is less than about 45 nm, the conductive resonator 140 may be lack of space for accommodating the accumulation gate 130. As shown in FIGS. 1B and 2B, the distance D4 between the first portion 142 and the second portion 144 of the conductive resonator 140 is greater than the distance D2 between the first portion 132 and the second portion 134 of the accumulation gate 130. In some embodiments, a height difference H1 between the bottom surface 142b and the bottom surface 146b is in a range of about 5 nm to about 120 nm, such that the accumulation gate 130 and the depletion gates 120 can be disposed beneath the third portion 146 of the conductive resonator 140 and the conductive resonator 140 can create strong magnetic fields.

Figure 4:
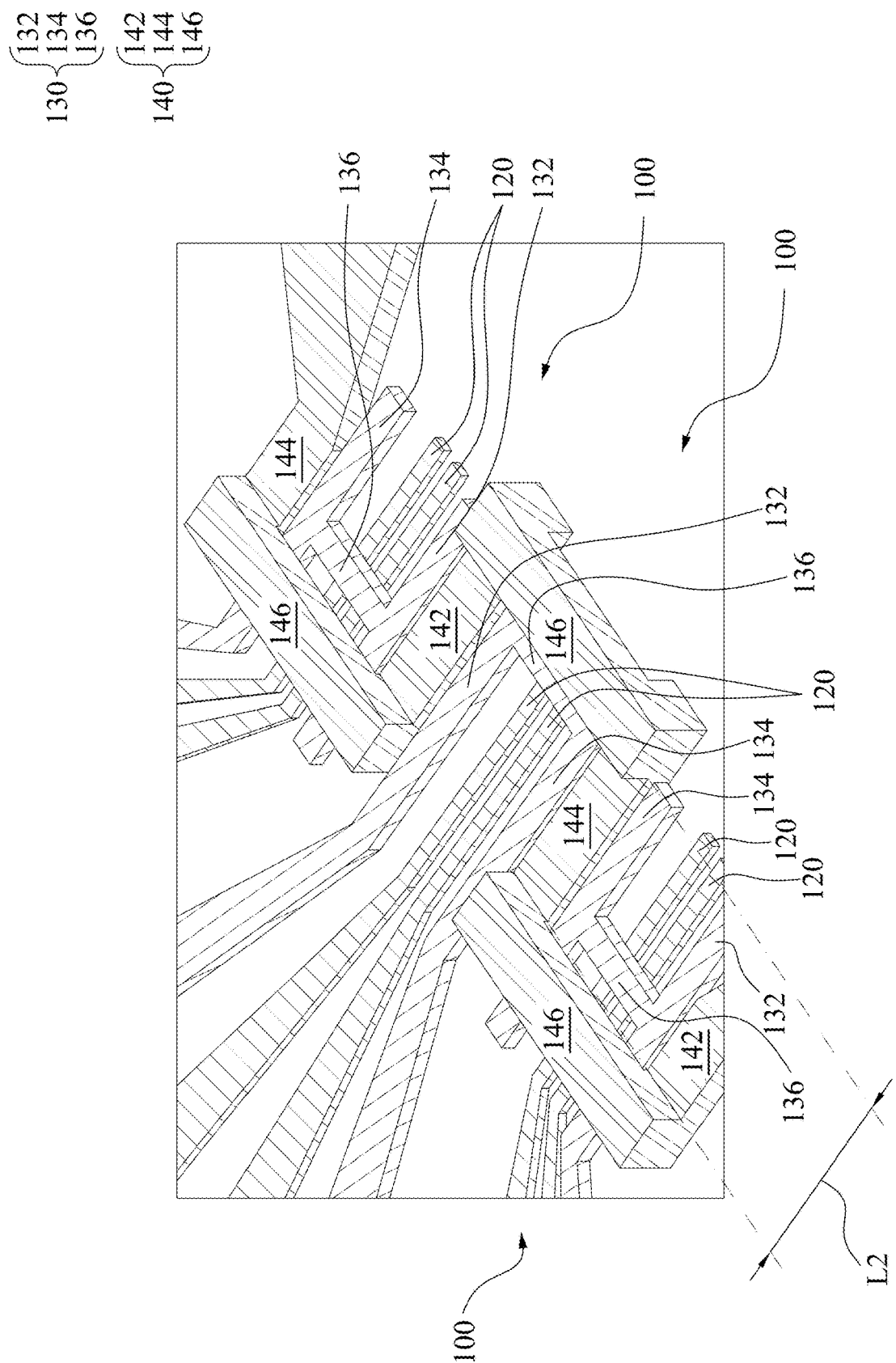
FIG. 4 is a perspective view of an electronic device in accordance with some embodiments of the present disclosure.

FIG. 4 is a perspective view of an electronic device 100a in accordance with some embodiments of the present disclosure. The difference between the electronic device 100a in FIG. 4 and the electronic device 100 in FIG. 1B pertains to the number of the qubits. Specifically, a plurality of the electronic device 100 in FIG. 1B can be combined to be the electronic device 100a in FIG. 4. As such, the electronic device 100a in FIG. 4 includes a plurality of the electronic devices 100 in FIG. 1B. The electronic devices 100 in FIG. 4 share a same conductive resonator 140. In greater detail, adjacent electronic devices 100 share the first portion 142 (or the second portion 144) of the conductive resonator 140. With such configuration, the electronic device 100a in FIG. 4 includes a plurality of qubits arranged in high density array. Further, the third portions 146 of the conductive resonator 140 of adjacent electronic devices 100 are misaligned with each other. In some embodiments, a length L2 of each of the first portion 142 and the second portion 144 is in a range of about 0.3 urn to about 10 urn. If the length L2 is less than about 0.3 urn, the magnetic fields B1 and B2 are reduced. Other relevant structural and manufacturing details of the electronic device 100a are substantially the same or similar to the electronic device 100 of FIGS. 1B-2B, and, therefore, a description in this regard will not be repeated hereinafter.

Figure 5A:
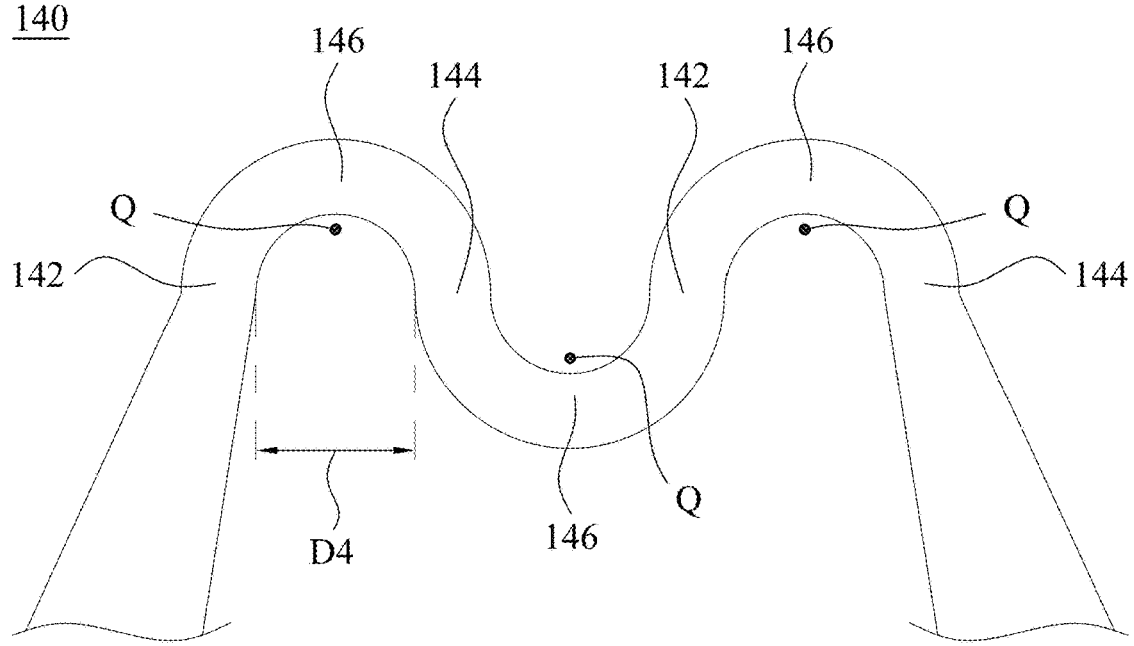
FIGS. 5A and 5B are top views of conductive resonators in accordance with some embodiments of the present disclosure.
Figure 5B:
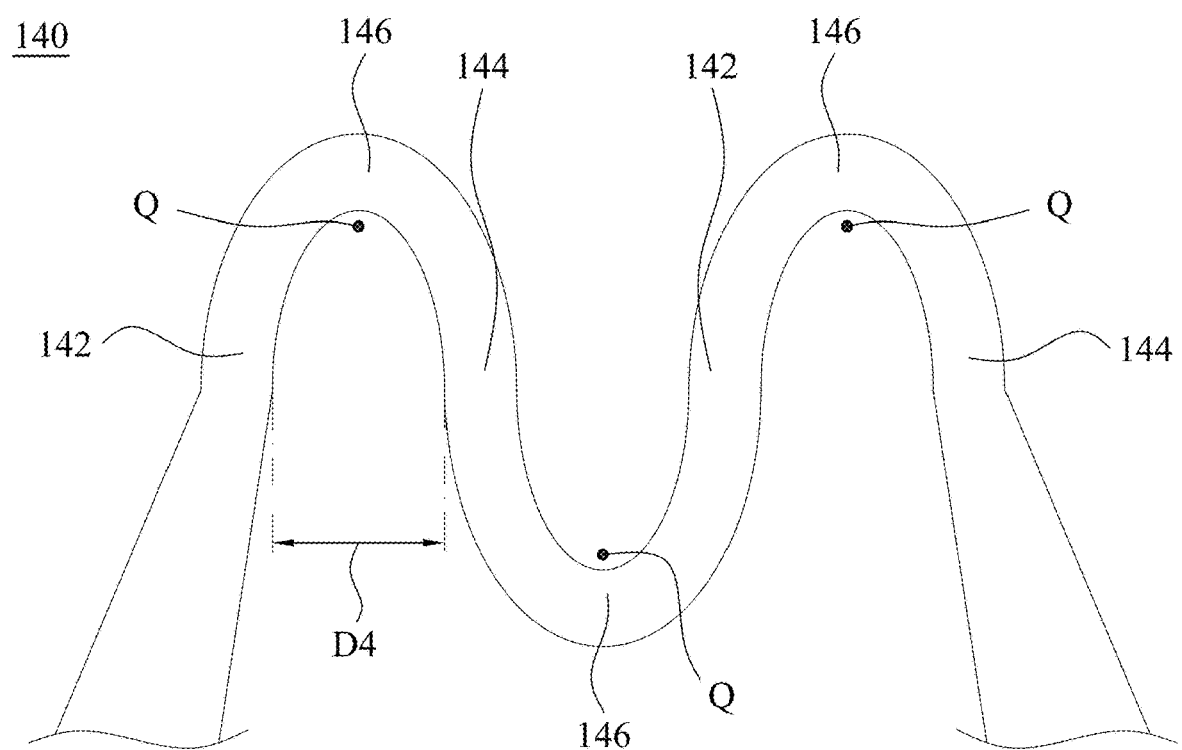

FIGS. 5A and 5B are top views of conductive resonators 140 in accordance with some embodiments of the present disclosure. The difference between the conductive resonators 140 in FIGS. 5A and 5B and the conductive resonator 140 in FIG. 4 pertains to the shape of the conductive resonator 140. In FIGS. 5A and 5B, the conductive resonators 140 have zigzag shapes. In FIG. 5A, the first portion 142, the second portion 144, and the third portion 146 form a semi-circle, and a distance D4' between the first portion 142 and the second portion 144 is in a range of about 45 nm to about 600 nm. In FIG. 5B, the first portion 142, the second portion 144, and the third portion 146 form a semi-oval ring. The qubit locations Q are adjacent to the third portions 146. Other relevant structural and manufacturing details of the conductive resonators 140 of FIGS. 5A 5B are substantially the same or similar to the conductive resonator 140 of FIG. 4, and, therefore, a description in this regard will not be repeated hereinafter.

FIGS. 6A-19B illustrate top views and cross-sectional views of intermediate stages in the formation of an electronic device 200 in accordance with some embodiments of the present disclosure. Throughout the various views and illustrative embodiments, like reference numbers are used to designate like elements. It is understood that additional operations can be provided before, during, and after the processes shown by FIGS. 6A-19B, and some of the operations described below can be replaced or eliminated, for additional embodiments of the method. The order of the operations/processes may be interchangeable.

Figure 6A:
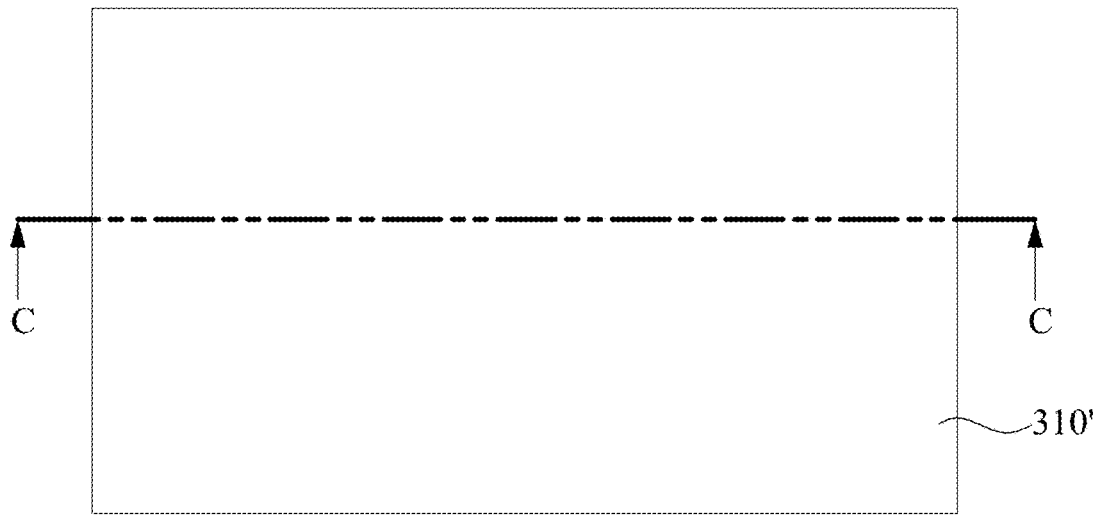
FIGS. 6A-19B illustrate top views and cross-sectional views of intermediate stages in the formation of an electronic device in accordance with some embodiments of the present disclosure.
Figure 6B:
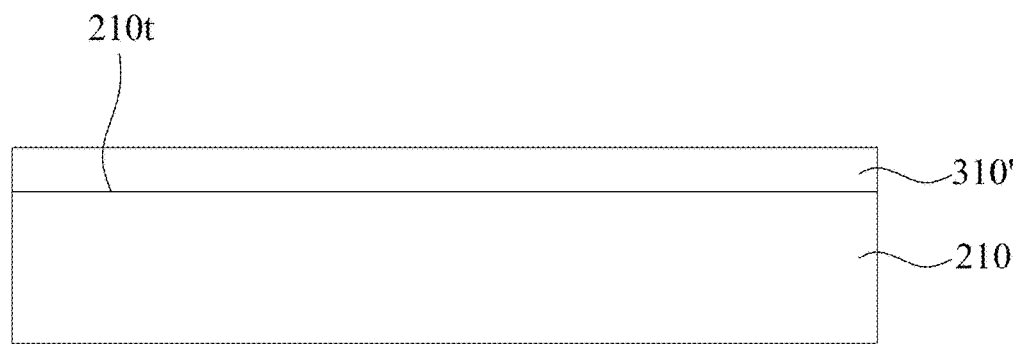

Reference is made to FIGS. 6A and 6B, where FIG. 6B is a cross-sectional view taken along line C-C of FIG. 6A. A substrate 210 is provided. In some embodiments, the substrate 210 may include silicon (Si). Alternatively, the substrate 210 may include germanium (Ge), silicon germanium, gallium arsenide (GaAs), or other appropriate semiconductor materials. In some alternative embodiments, the substrate 210 may include an epitaxial layer with or without dopants. Furthermore, the substrate 210 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen technology, wafer bonding, selective epitaxial growth (SEG), or other appropriate method. In some embodiments, the substrate 210 has a thickness greater than about 500 μm to improve the performance of the electronic device 200.

A mask layer 310' (may be a hard mask layer) is formed over the top surface 210t of the substrate 210. In some embodiments, the mask layer 310' includes nitride. For example, the mask layer 310' is made of silicon nitride (SiN). However, other materials, such as SiON, silicon carbide, or combinations thereof, may also be used. The mask layer 310' may be formed by a process such as chemical vapor deposition (CVD), plasma enhanced chemical vapor deposition (PECVD), or low pressure chemical vapor deposition (LPCVD). Alternatively, the mask layer 310' may be made of a silicon oxide and then converted to SiN by nitridation.

Figure 7A:
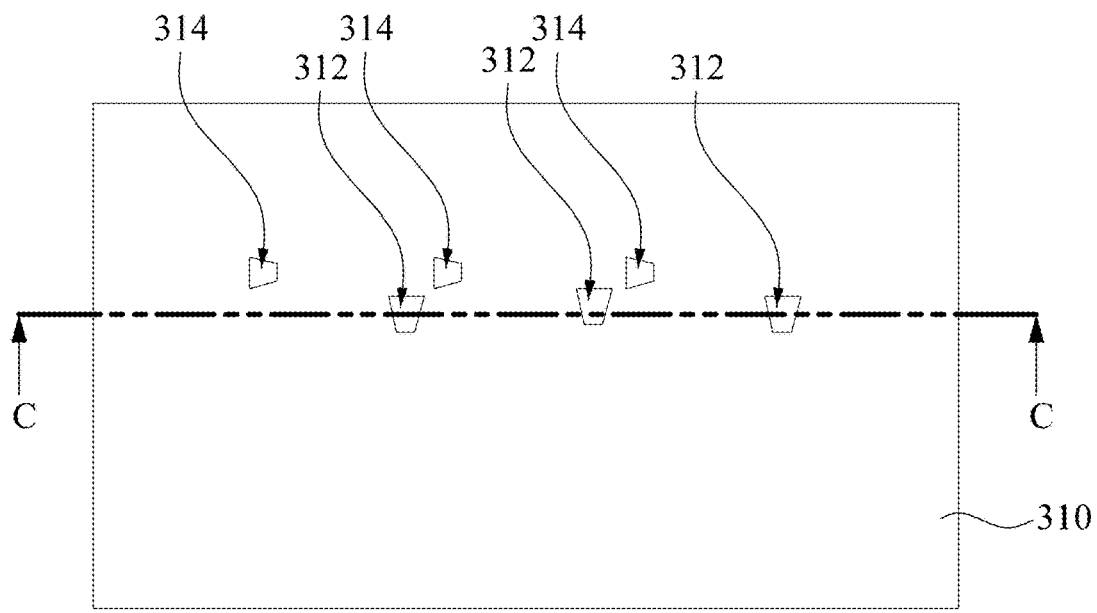
Figure 7B:
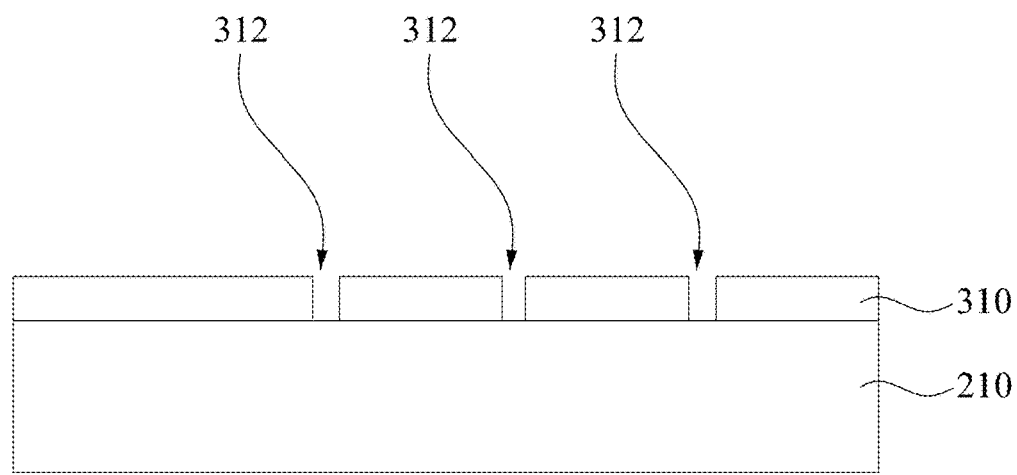

Reference is made to FIGS. 7A and 7B, where FIG. 7B is a cross-sectional view taken along line C-C of FIG. 7A. The mask layer 310' in FIGS. 6A and 6B is then patterned by a lithography technique. For example, a photoresist layer can be formed over the structure in FIGS. 6A and 6B, and the photoresist layer is exposed and then developed to form a patterned photoresist layer, which leaves exposed a portion of the mask layer 310'. The mask layer 310' is then etched using a reactive ion etch (RIE) and/or other suitable process, and the patterned photoresist layer is used as an etch mask for etching the mask layer 310'. After the etching process, a patterned mask layer 310 having source openings 312 and drain openings 314 is formed over the substrate 210, and the patterned photoresist layer is removed. In some embodiments, the patterned photoresist layer may be removed using a process such as ashing, etching, or the like. The source openings 312 and the drain openings 314 respectively expose portions of the substrate 210.

Figure 8A:
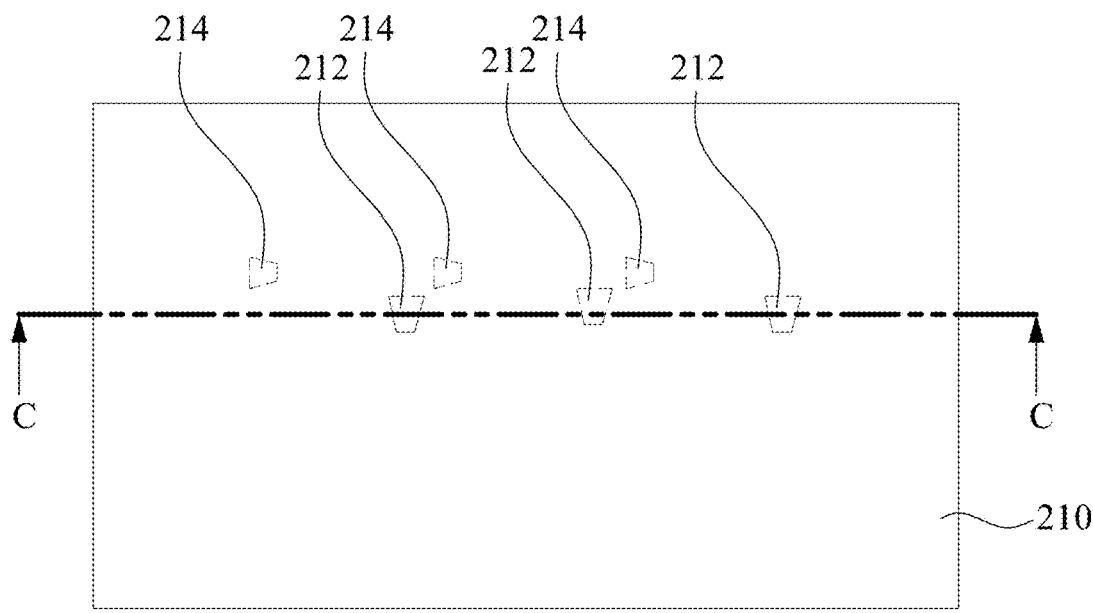
Figure 8B:
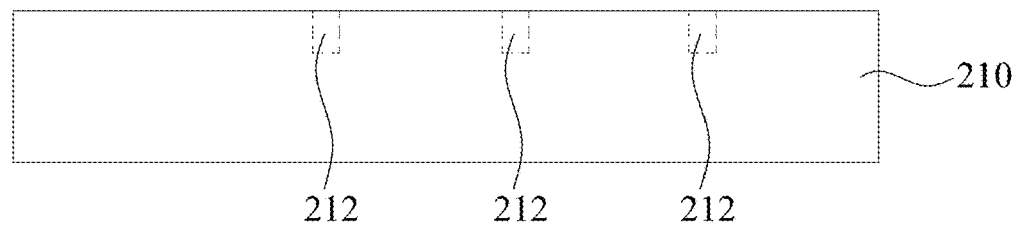

Reference is made to FIGS. 8A and 8B, where FIG. 8B is a cross-sectional view taken along line C-C of FIG. 8A. An implantation process is then performed to introduce impurities into the substrate 210 through the source openings 312 and the drain openings 314 to form source regions 212 and drain regions 214, and the mask layer 310 (see FIGS. 7A and 7B) may act as a mask to substantially prevent the impurities from being implanted into other regions of the substrate 210. The impurities may be n-type impurities or p-type impurities. The n-type impurities may be phosphorus, arsenic, or the like, and the p-type impurities may be boron, $BF_2$, or the like.

Subsequently, the patterned mask layer 310 is removed. The patterned mask layer 310 may be removed using a process such as wet etching, or the like. After the removal process, the substrate 210 with the source regions 212 and drain regions 214 is exposed. After the patterned mask layer 310 is removed, one or more annealing processes may be performed to activate the source regions 212 and drain regions 214. The annealing processes include rapid thermal annealing (RTA) and/or laser annealing processes. The annealing processes may repair implant damage from the impurities on the bottom and sidewalls of the source regions 212 and drain regions 214.

Figure 9A:
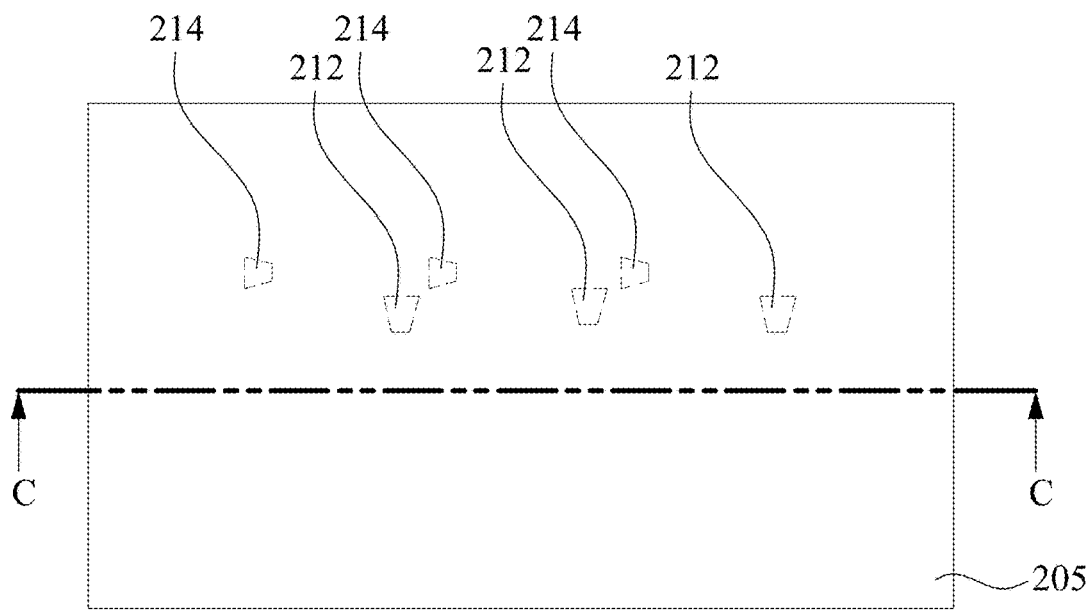
Figure 9B:
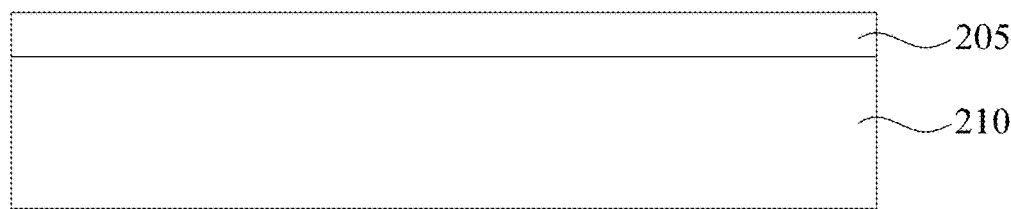

Reference is made to FIGS. 9A and 9B, where FIG. 9B is a cross-sectional view taken along line C-C of FIG. 9A. A first isolation layer 205 is formed over the substrate 210. Specifically, the first isolation layer 205 may include materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first isolation layer 205 may be deposited by a PECVD process or other suitable deposition technique.

Figure 10A:
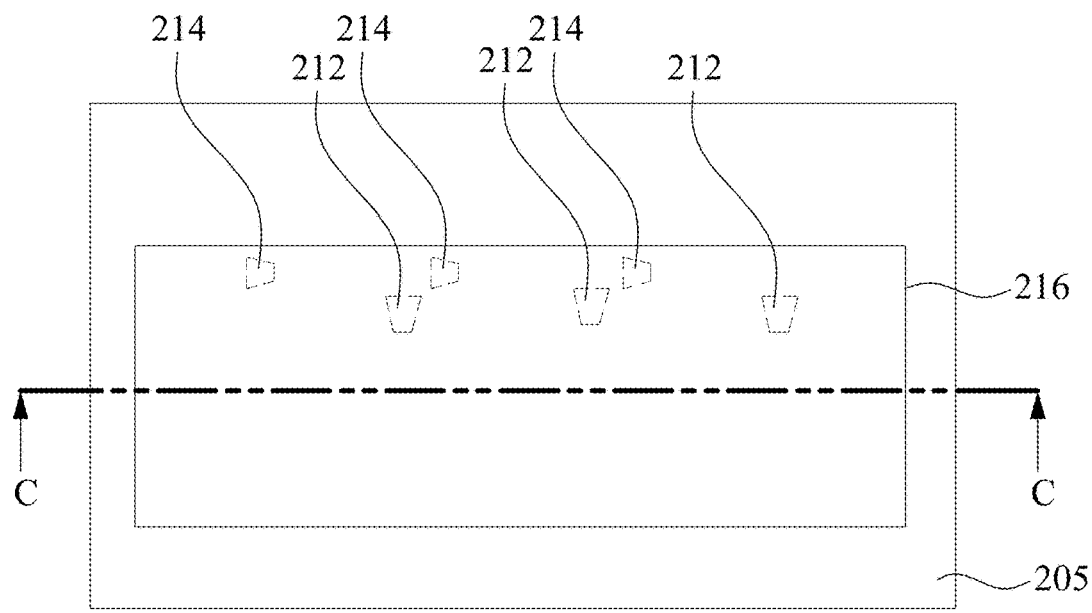
Figure 10B:

Reference is made to FIGS. 10A and 10B, where FIG. 10B is a cross-sectional view taken along line C-C of FIG. 10A. An opening 207 is formed in the first isolation layer 205 to define an active region 216 in the substrate 210. In some embodiments, the opening 207 are formed using a combination of photolithography and etching process as mentioned above. In some embodiments, the etching process is a wet etching process. The opening 207 exposes a portion of the substrate 210, the source regions 212, and the drain regions 214. The exposed portion of the substrate 210 is defined as the active region 216. The top view of the active region 216 may be circular, elliptical, rectangular, square, or some other shapes with or without rounded corners.

Figure 11A:
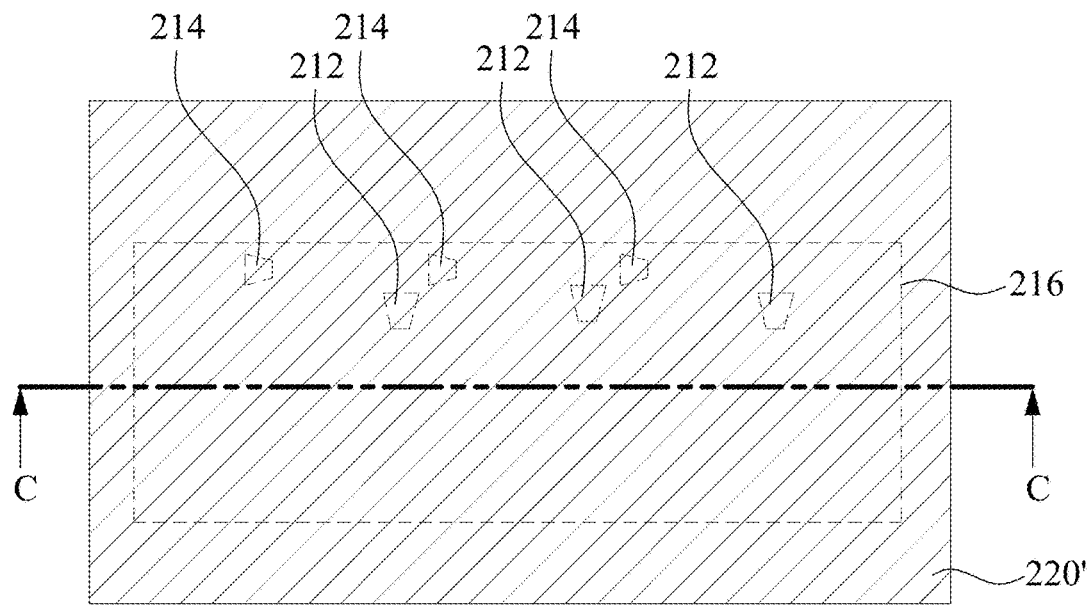
Figure 11B:
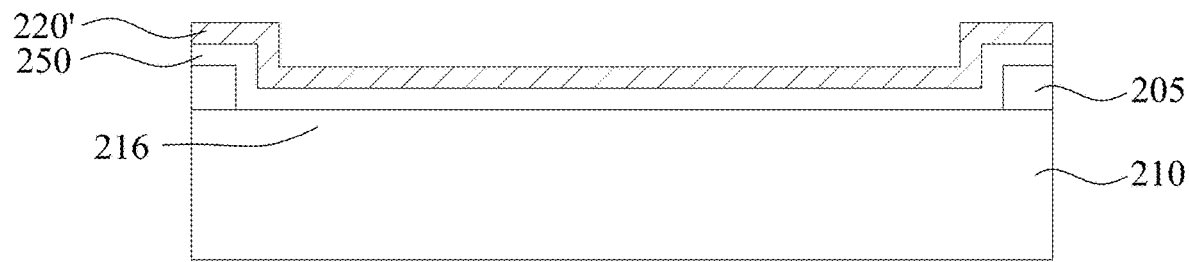

Reference is made to FIGS. 11A and 11B, where FIG. 11B is a cross-sectional view taken along line C-C of FIG. 11A. A first gate dielectric layer 250 and a first conductive layer 220' are sequentially formed over the structure in FIGS. 10A and 10B. The first gate dielectric layer 250 is conformally formed in the opening 207. The first gate dielectric layer 250 is over the active region 216, the source regions 212, and the drain regions 214. In some embodiments, the first gate dielectric layer 250 may include silicon dioxide, silicon nitride, or other suitable material. Alternatively, the first gate dielectric layer 250 can be a high-x dielectric layer having a dielectric constant (κ) higher than the dielectric constant of $SiO_2$, i.e. κ>3.9. The first gate dielectric layer 250 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The first gate dielectric layer 250 is deposited by suitable techniques, such as ALD, CVD, PVD, thermal oxidation, combinations thereof, or other suitable techniques.

The first conductive layer 220' is formed over the first gate dielectric layer 250. The first conductive layer 220' includes one or more layers of conductive material. Examples of the first conductive layer 220' include W, Ti, TiAlC, Al, TiAl, TaN, TaAlC, TiN, TiC, Co, TaC, Al, TiAl, HfTi, TiSi, TaSi, TiAlC, combinations thereof, or the like. The first conductive layer 220' may be formed by chemical vapor deposition (CVD), physical vapor deposition (PVD) including sputtering, atomic layer deposition (ALD) or other suitable method.

Figure 12A:
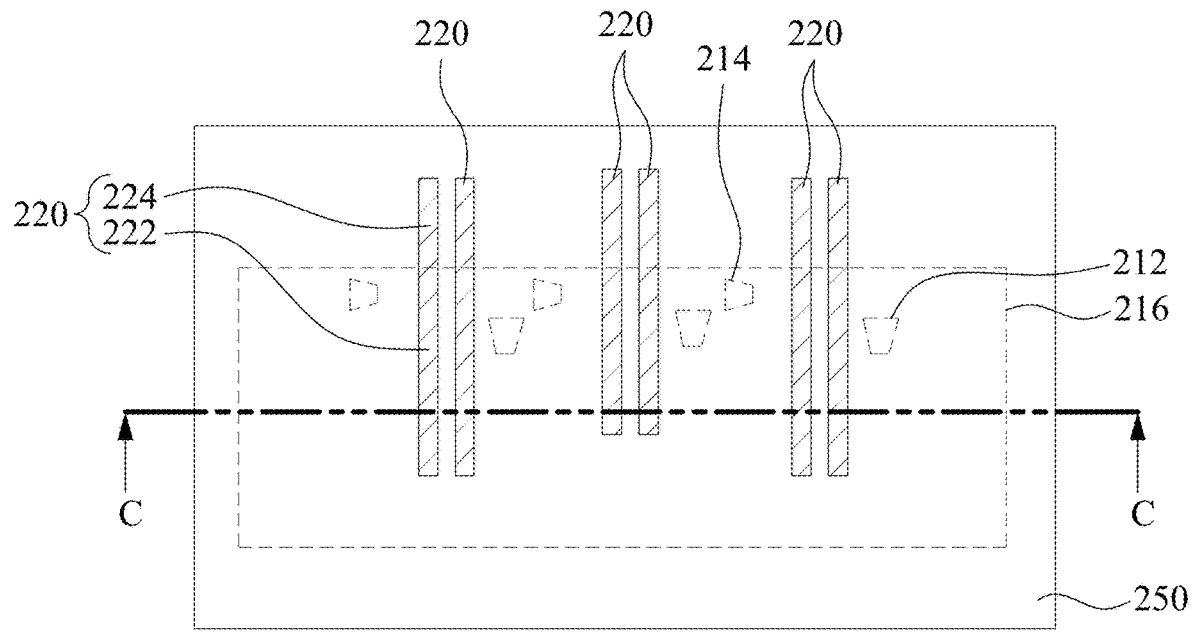
Figure 12B:
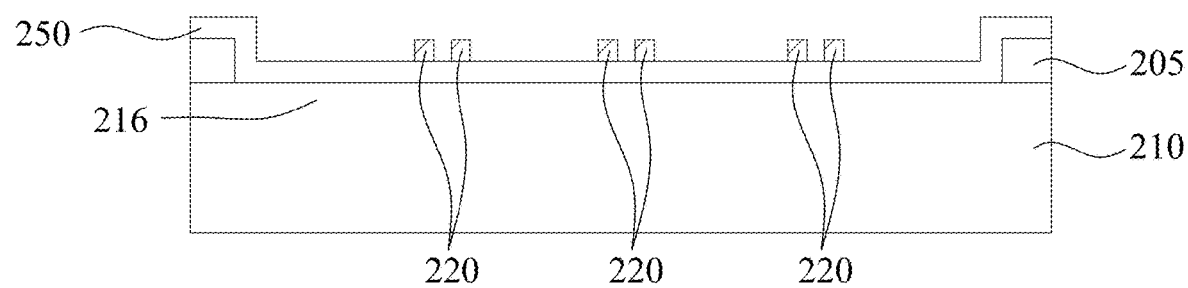

Reference is made to FIGS. 12A and 12B, where FIG. 12B is a cross-sectional view taken along line C-C of FIG. 12A. The first conductive layer 220' in FIGS. 11A and 11B is patterned to form depletion gates 220. In FIGS. 12A and 12B, there are three pairs of the depletion gates 220 for example. The patterning of the first conductive layer 220' may be formed using a combination of photolithography and etching process as mentioned above. Each pair of the depletion gates 220 are formed between one of the source regions 212 and one of the drain regions 214. A portion 222 of each of the depletion gates 220 is over the active region 216, another portion 224 of each of the depletion gates 220 extends over the first isolation layer 250 to be landing pads for the following formed contact. The depletion gates 220 are spaced apart from each other.

Figure 13A:
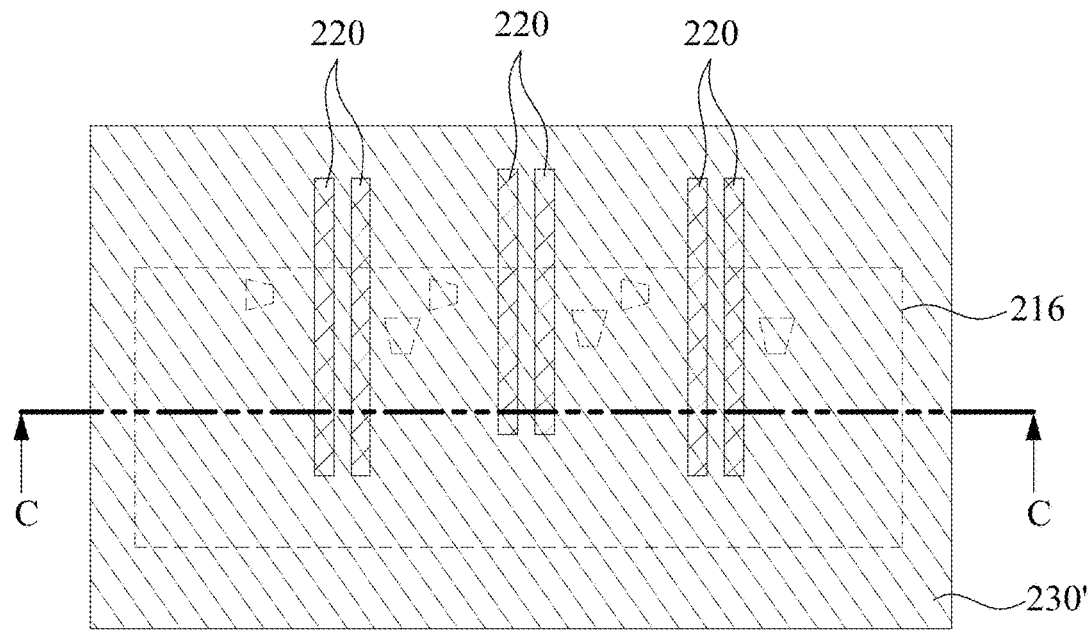
Figure 13B:
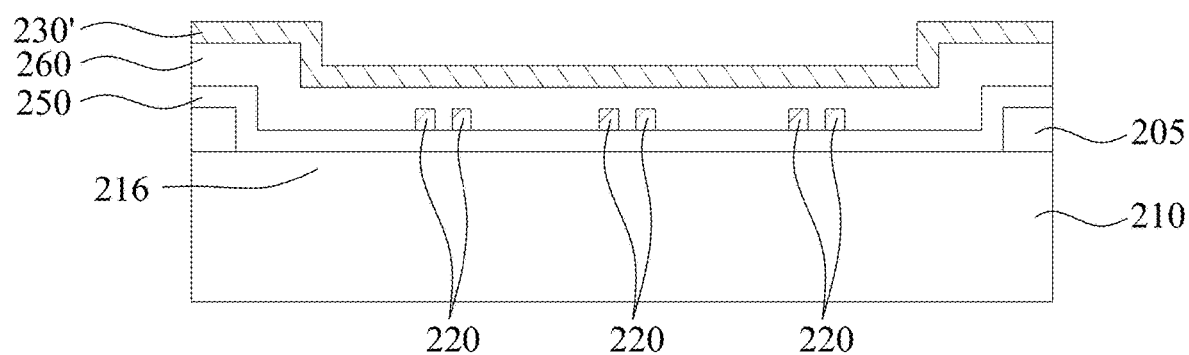

Reference is made to FIGS. 13A and 13B, where FIG. 13B is a cross-sectional view taken along line C-C of FIG. 13A. A second gate dielectric layer 260 and a second conductive layer 230' are sequentially formed over the first gate dielectric layer 250 and the depletion gates 220. The second gate dielectric layer 260 is conformally formed over the first gate dielectric layer 250 and the depletion gates 220, such that the second gate dielectric layer 260 covers the first gate dielectric layer 250 and the depletion gates 220. In some embodiments, the second gate dielectric layer 260 may include silicon dioxide, silicon nitride, or other suitable material. Alternatively, the second gate dielectric layer 260 can be a high-κ dielectric layer having a dielectric constant (κ) higher than the dielectric constant of $SiO_2$, i.e. κ>3.9. The second gate dielectric layer 260 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The second gate dielectric layer 260 is deposited by suitable techniques, such as ALD, CVD, PVD, thermal oxidation, combinations thereof, or other suitable techniques.

Subsequently, the second conductive layer 230' is formed over the second gate dielectric layer 260. The second conductive layer 230' includes one or more layers of conductive material. Examples of the second conductive layer 230' include W, Ti, TiAlC, Al, TiAl, TaN, TaAlC, TiN, TiC, Co, TaC, Al, TiAl, HfTi, TiSi, TaSi, TiAlC, combinations thereof, or the like. The second conductive layer 230' may be formed by chemical vapor deposition (CVD), physical vapor deposition (PVD) including sputtering, atomic layer deposition (ALD) or other suitable method. The first and second conductive layers 220' and 230' (i.e., the depletion gates 220 and the following formed accumulation gates 230) are made of the same or different materials.

Figure 14A:
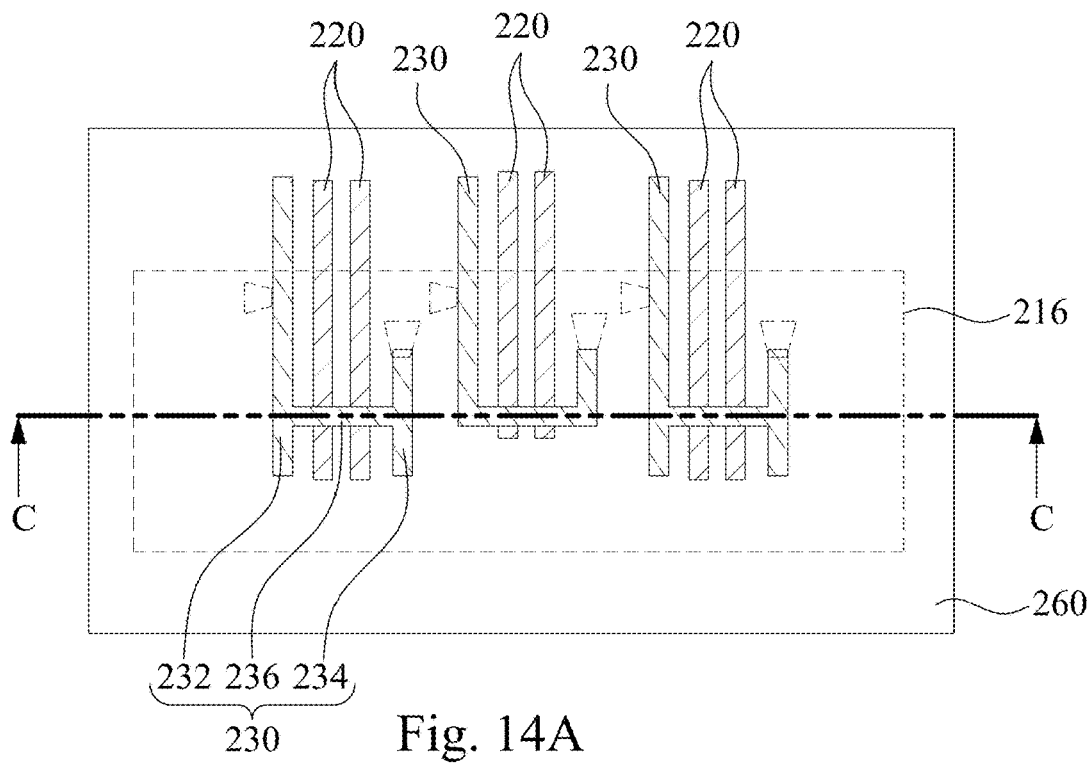
Figure 14B:
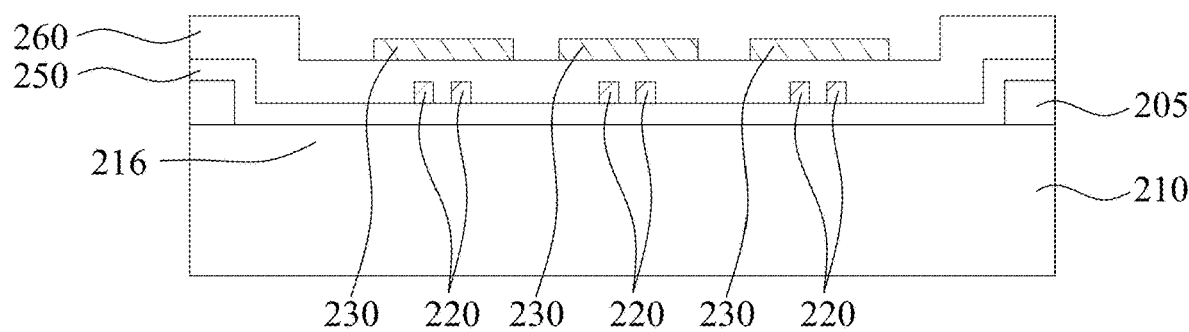

Reference is made to FIGS. 14A and 14B, where FIG. 14B is a cross-sectional view taken along line C-C of FIG. 14A. The second conductive layer 230' in FIGS. 13A and 13B is patterned to form the accumulation gates 230. The patterning of the second conductive layer 230' may be formed using a combination of photolithography and etching process as mentioned above. Each of the accumulation gates 230 includes a first portion 232, a second portion 234, and a third portion 236 interconnecting the first portion 232 and the second portion 234.

Figure 15A:
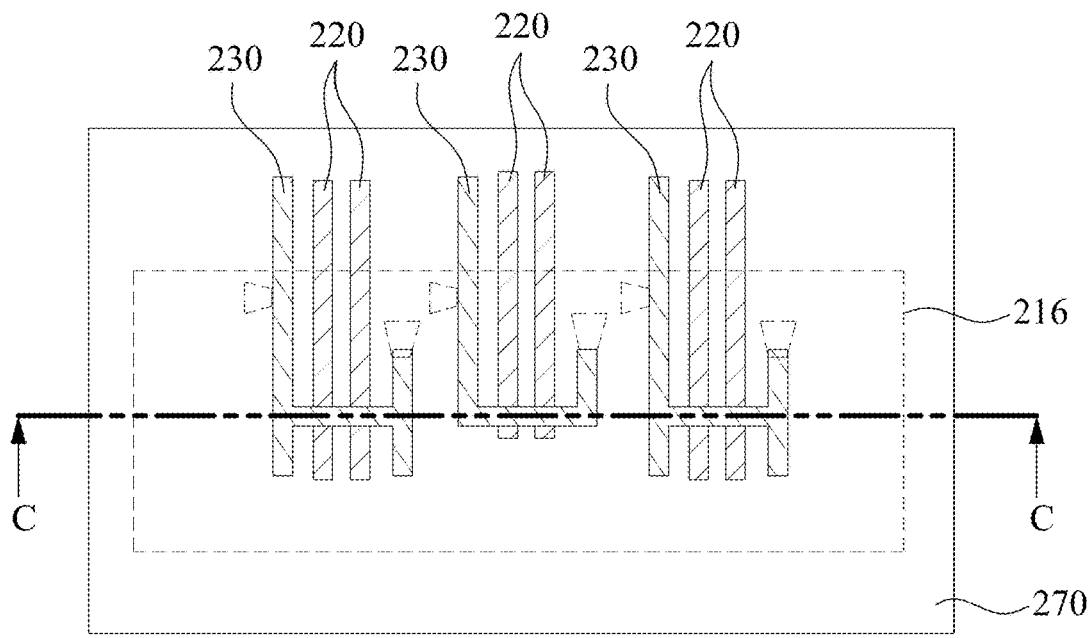
Figure 15B:
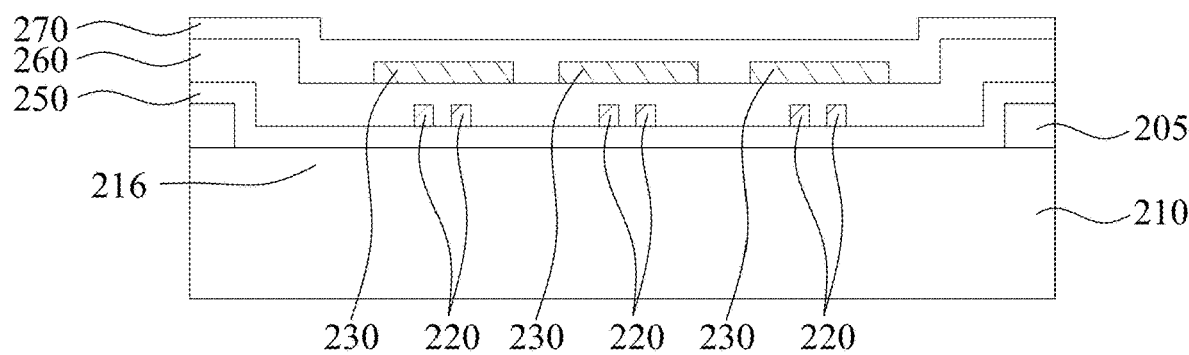

Reference is made to FIGS. 15A and 15B, where FIG. 15B is a cross-sectional view taken along line C-C of FIG. 15A. A second isolation layer 270 is formed over the second gate dielectric layer 260 and the accumulation gates 230. Specifically, the second isolation layer 270 covers the accumulation gates 230 and may include materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second isolation layer 270 may be deposited by a PECVD process or other suitable deposition technique.

Figure 16A:
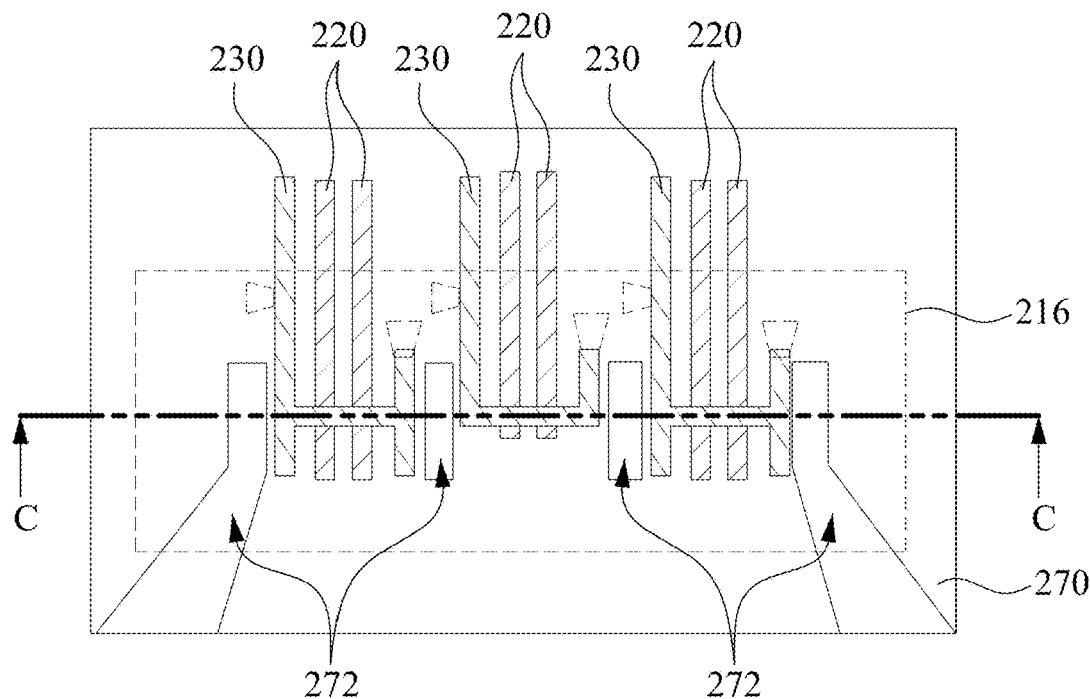
Figure 16B:
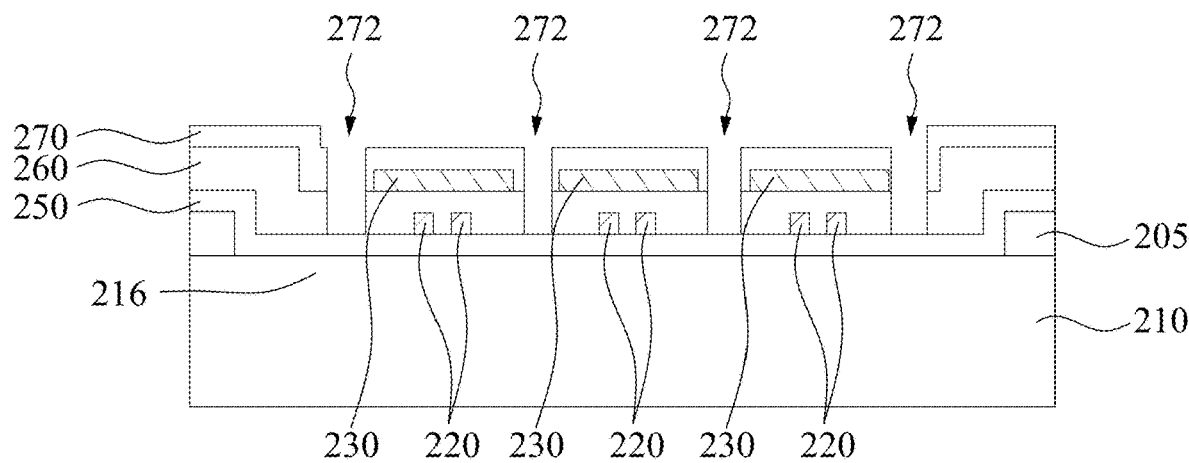

Reference is made to FIGS. 16A to 16B, where FIG. 16B is a cross-sectional view taken along B-B of FIG. 16A. A plurality of openings 272 are formed in the second isolation layer 270. The openings 272 further extend into the second gate dielectric layer 260. In some embodiments, the openings 272 are formed using a combination of photolithography and etching process as mentioned above. The openings 272 are not overlap with the accumulation gates 230 such that the openings 272 do not expose the accumulation gates 230 and the depletion gates 220.

Figure 17A:
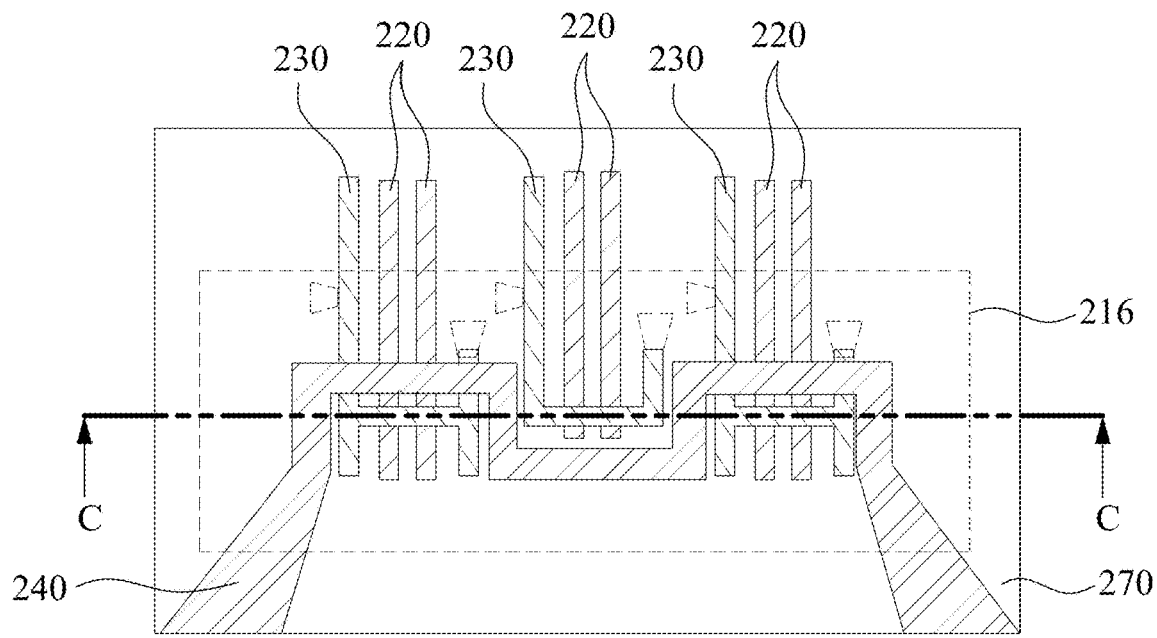
Figure 17B:
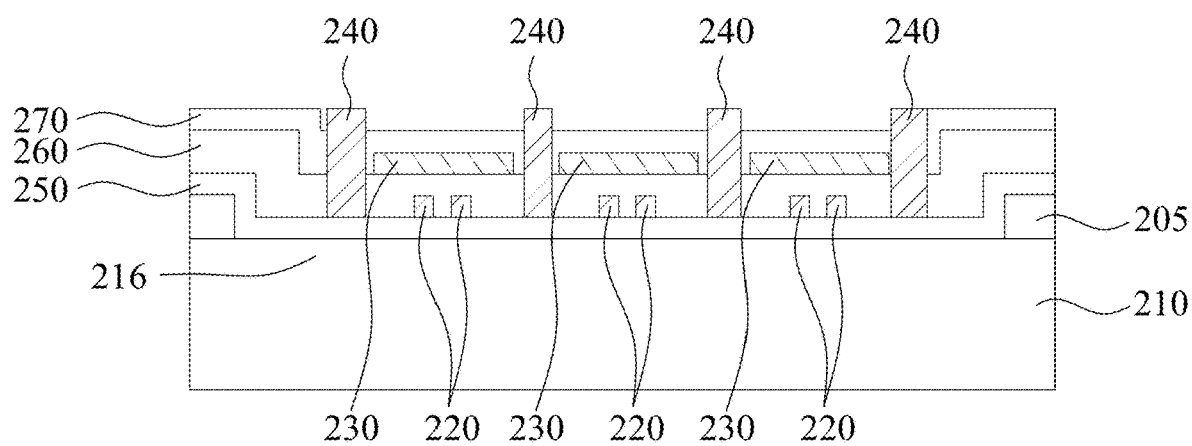

Reference is made to FIGS. 17A and 17B, where FIG. 17B is a cross-sectional view taken along line C-C of FIG. 17A. A third conductive layer is formed over the second isolation layer 270 and fills the openings 272, and the third conductive layer is patterned to form a conductive resonator 240 using a combination of photolithography and etching process. In some embodiments, the conductive resonator 240 includes one or more layers of conductive material. Examples of the conductive resonator 240 include W, Ti, TiAlC, Al, TiAl, TaN, TaAlC, TiN, TiC, Co, TaC, Al, TiAl, HfTi, TiSi, TaSi, TiAlC, combinations thereof, or the like. The conductive resonator 240 may be formed by chemical vapor deposition (CVD), physical vapor deposition (PVD) including sputtering, atomic layer deposition (ALD) or other suitable method. As shown in FIG. 17A, portions of the conductive resonator 240 outside the openings 272 are the third portions of the conductive resonator 240.

Figure 18A:
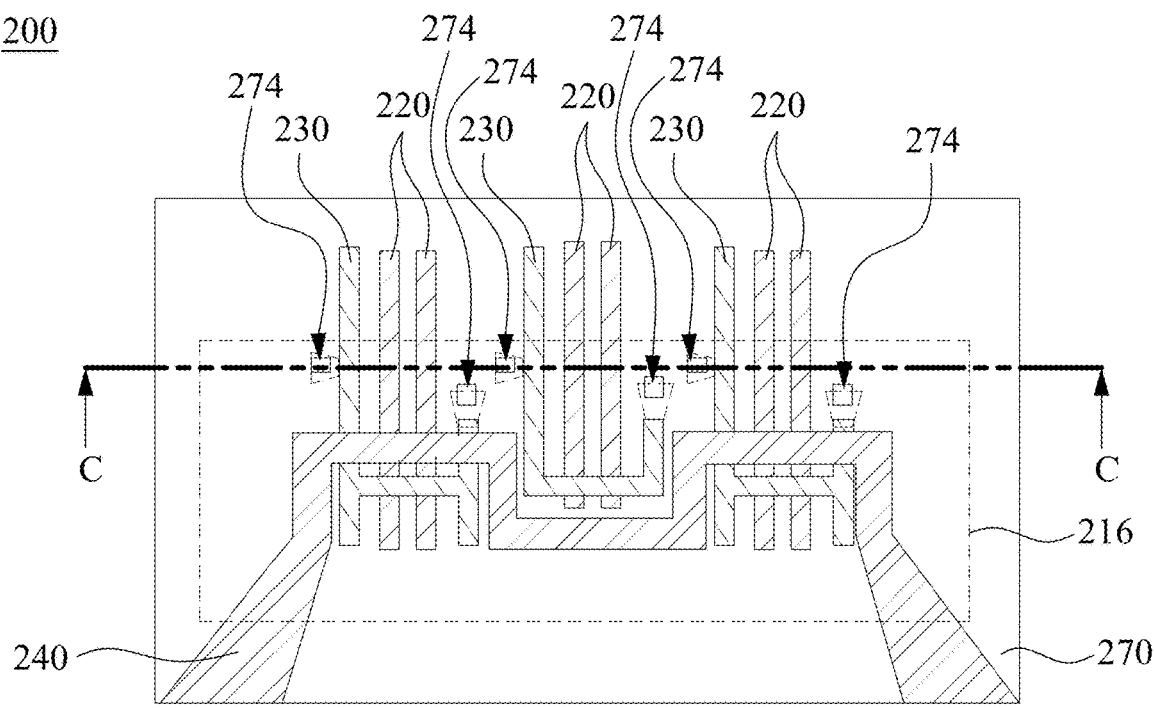
Figure 18B:
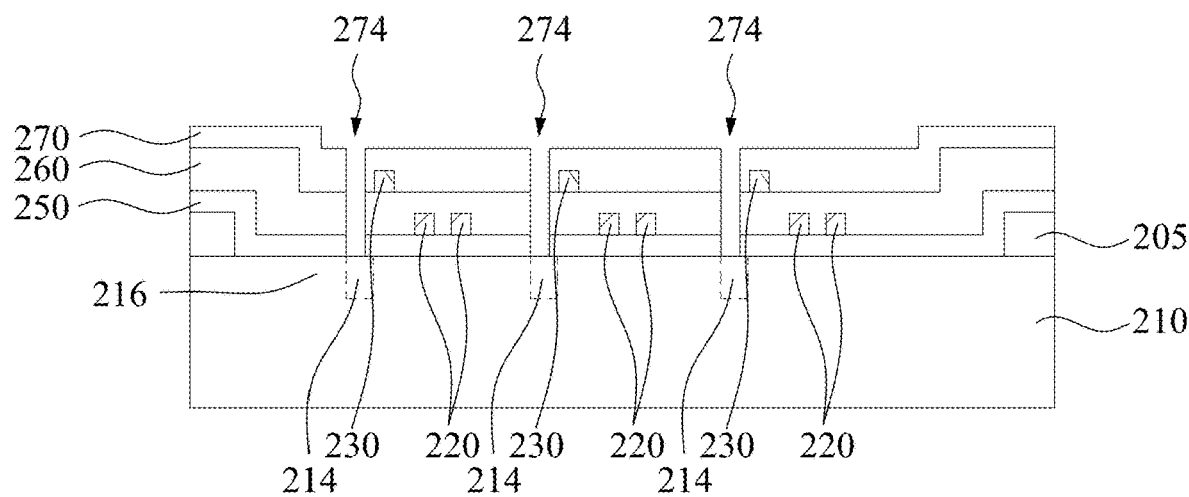

Reference is made to FIGS. 18A and 18B, where FIG. 18B is a cross-sectional view taken along line C-C of FIG. 18A. The second isolation layer 270 is further etched to form a plurality of openings 274 by various methods, including a dry etch, a wet etch, or a combination of dry etch and wet etch. The openings 274 extend through the second isolation layer 270 (and the underlying dielectric layers) and respectively expose the source regions 212 and the drain regions 214. In some embodiments, the openings 274 are formed using a combination of photolithography and etching process as mentioned above.

Figure 19A:
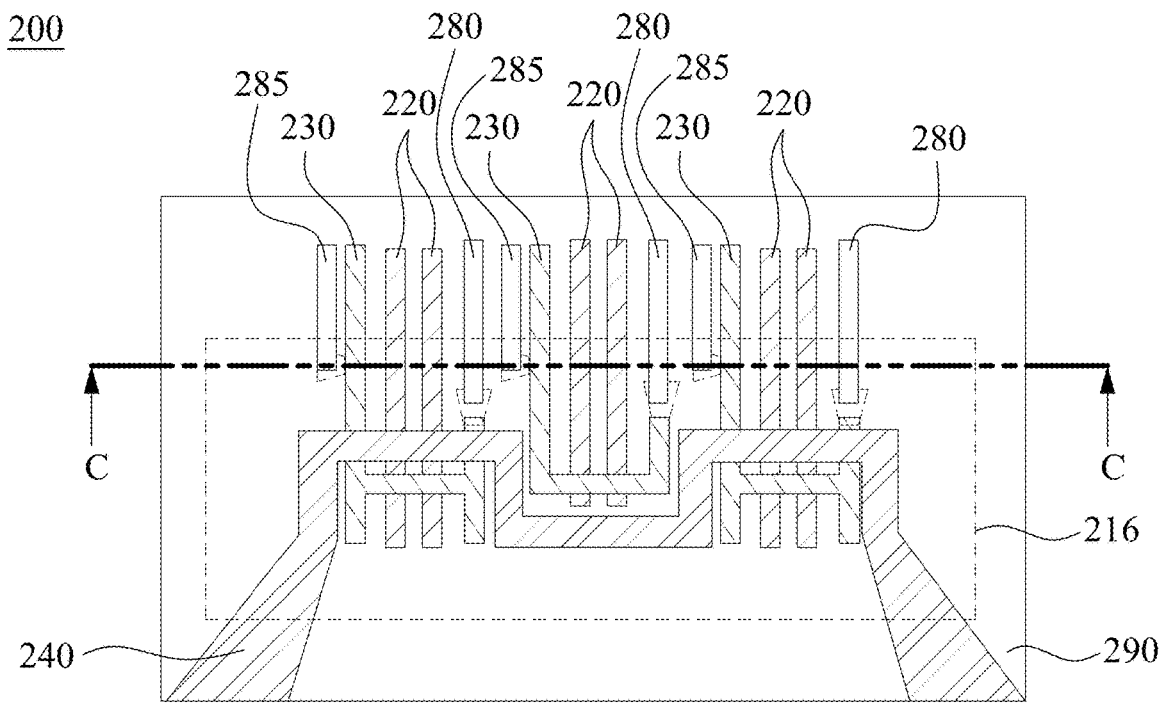
Figure 19B:
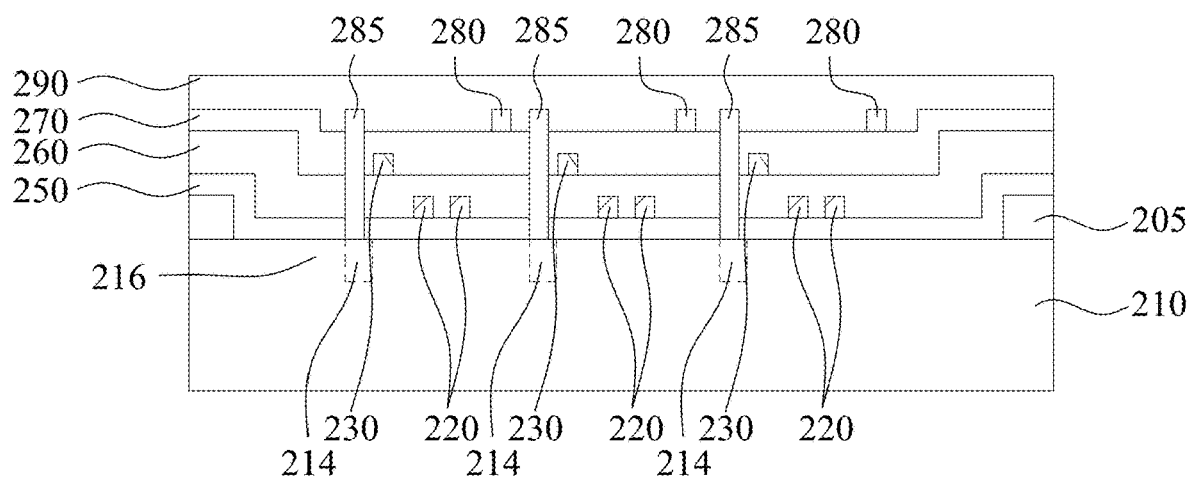

Reference is made to FIGS. 19A and 19B, where FIG. 19B is a cross-sectional view taken along line C-C of FIG. 19A. A fourth conductive layer is formed over the second isolation layer 270 and fills the openings 274, and the fourth conductive layer is patterned to form source contacts 280 and drain contacts 285 using a combination of photolithography and etching process. In some embodiments, the source contacts 280 and the drain contacts 285 include one or more layers of conductive material. Examples of the source contacts 280 and the drain contacts 285 include W, Ti, TiAlC, Al, TiAl, TaN, TaAlC, TiN, TiC, Co, TaC, Al, TiAl, HfTi, TiSi, TaSi, TiAlC, combinations thereof, or the like. The source contacts 280 and the drain contacts 285 may be formed by chemical vapor deposition (CVD), physical vapor deposition (PVD) including sputtering, atomic layer deposition (ALD) or other suitable method. In some embodiments, a mask layer is formed above the conductive resonator 240 to protect the conductive resonator 240 prior to forming the fourth conductive layer, and the mask layer is removed after the formation of the source contacts 280 and the drain contacts 285.

Optionally, a protection layer 290 is formed over the second isolation layer 270, the conductive resonator 240, the source contacts 280, and the drain contacts 285. In some embodiments, the protection layer 290 may include silicon dioxide, silicon nitride, or other suitable material. Alternatively, the protection layer 290 can be a high-K dielectric layer having a dielectric constant ($\kappa$) higher than the dielectric constant of $SiO_2$, i.e. $\kappa > 3.9$. The protection layer 290 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The protection layer 290 is deposited by suitable techniques, such as ALD, CVD, PVD, thermal oxidation, combinations thereof, or other suitable techniques.

Figure 20A:
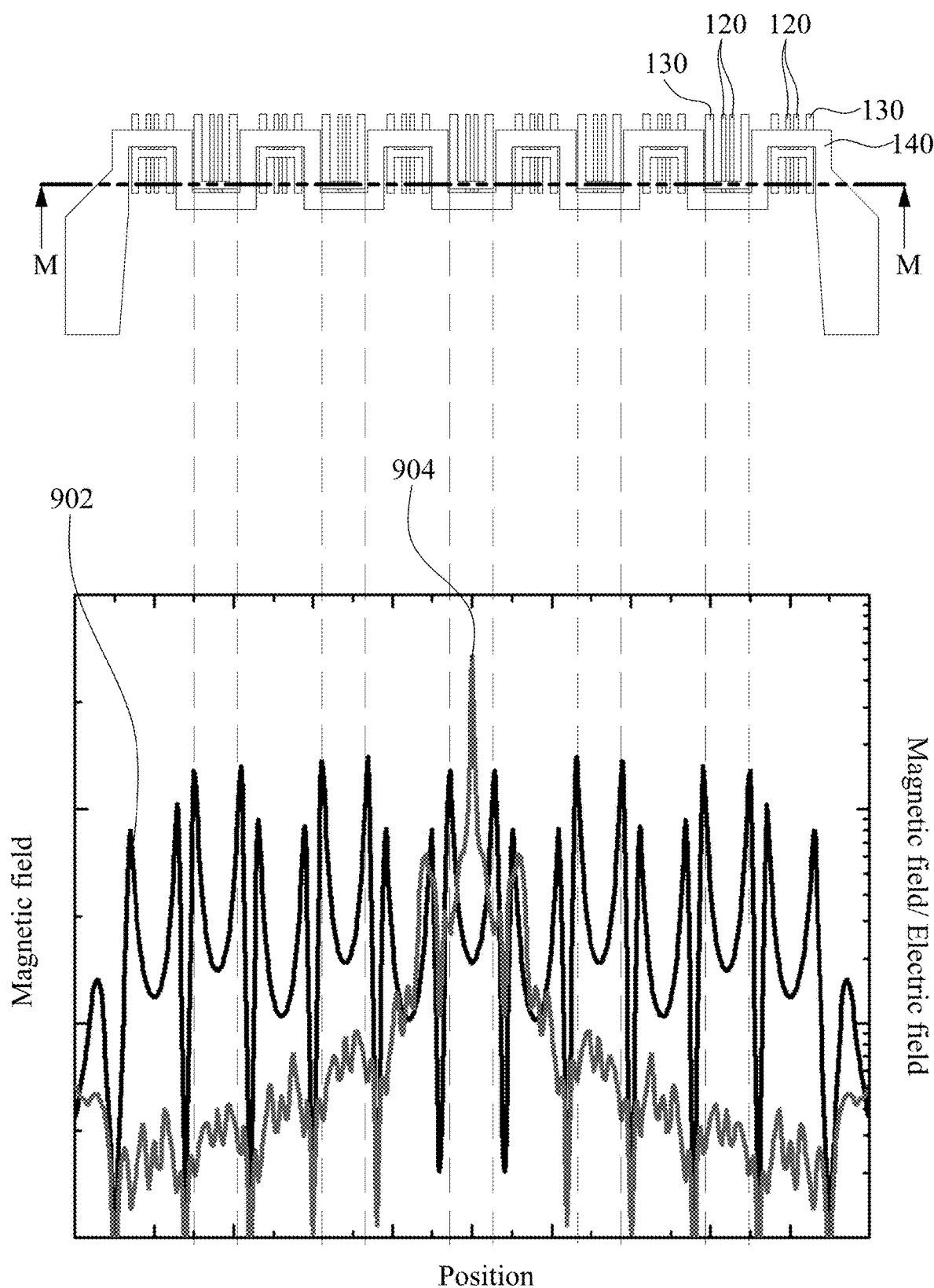
FIGS. 20A and 20B illustrate simulation results of magnetic field and ratios of total magnetic field to electric field of an electronic device at different positions.
Figure 20B:
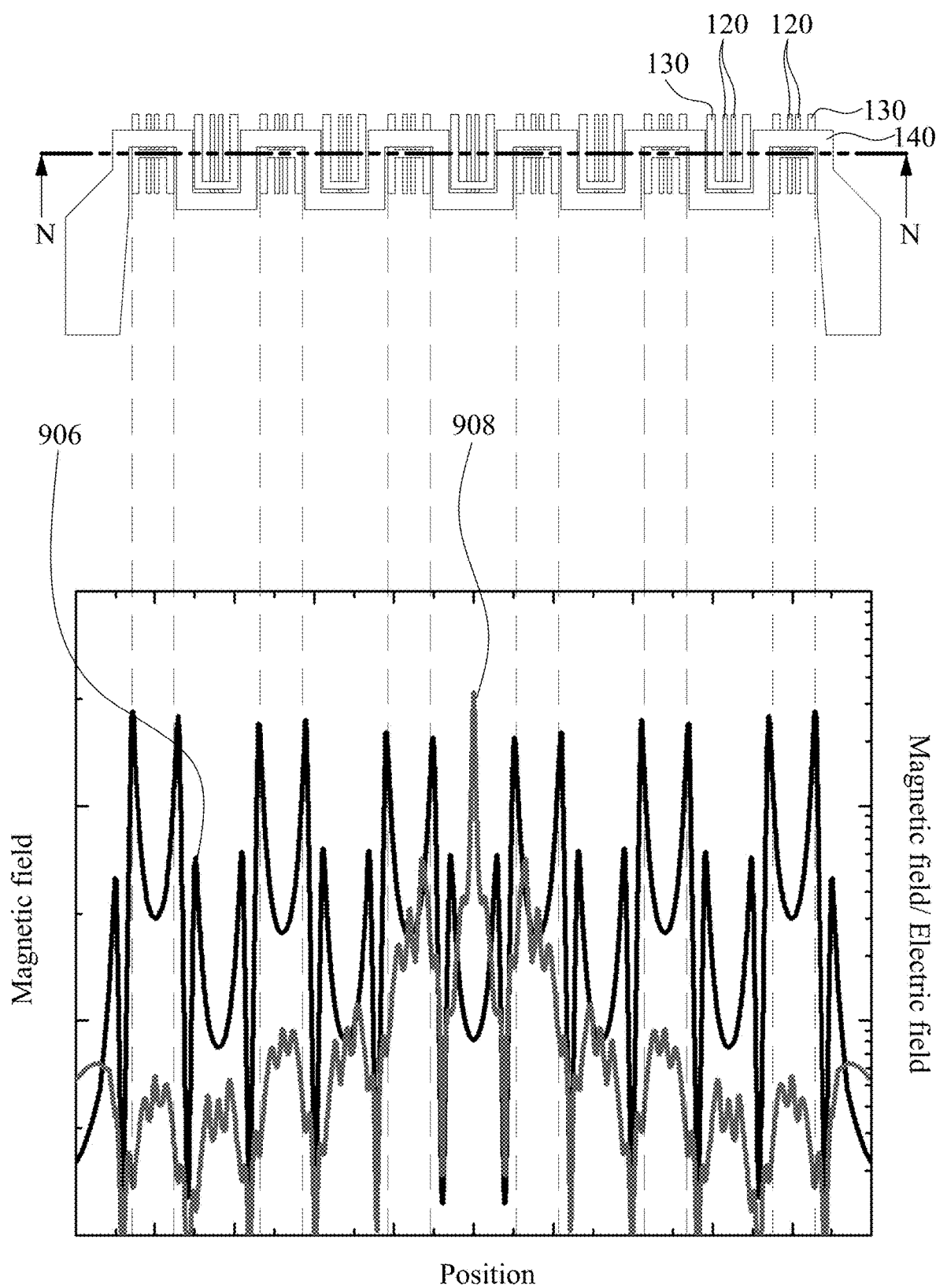

FIGS. 20A and 20B illustrate simulation results of magnetic field and ratios of total magnetic field to electric field of an electronic device at different positions. In FIGS. 20A and 20B, the electronic device includes 11 qubits, and the magnetic field values and ratios of total magnetic field to electric field values are illustrated as a function of position. In FIG. 20A, curve 902 represents the magnetic field values taken along line M-M, and curve 904 represents the ratio of total magnetic field to electric field values taken along line M-M. In FIG. 20B, curve 906 represents the magnetic field values taken along line N-N, and curve 908 represents the ratio of total magnetic field to electric field values taken along line N-N.

Figure 21:
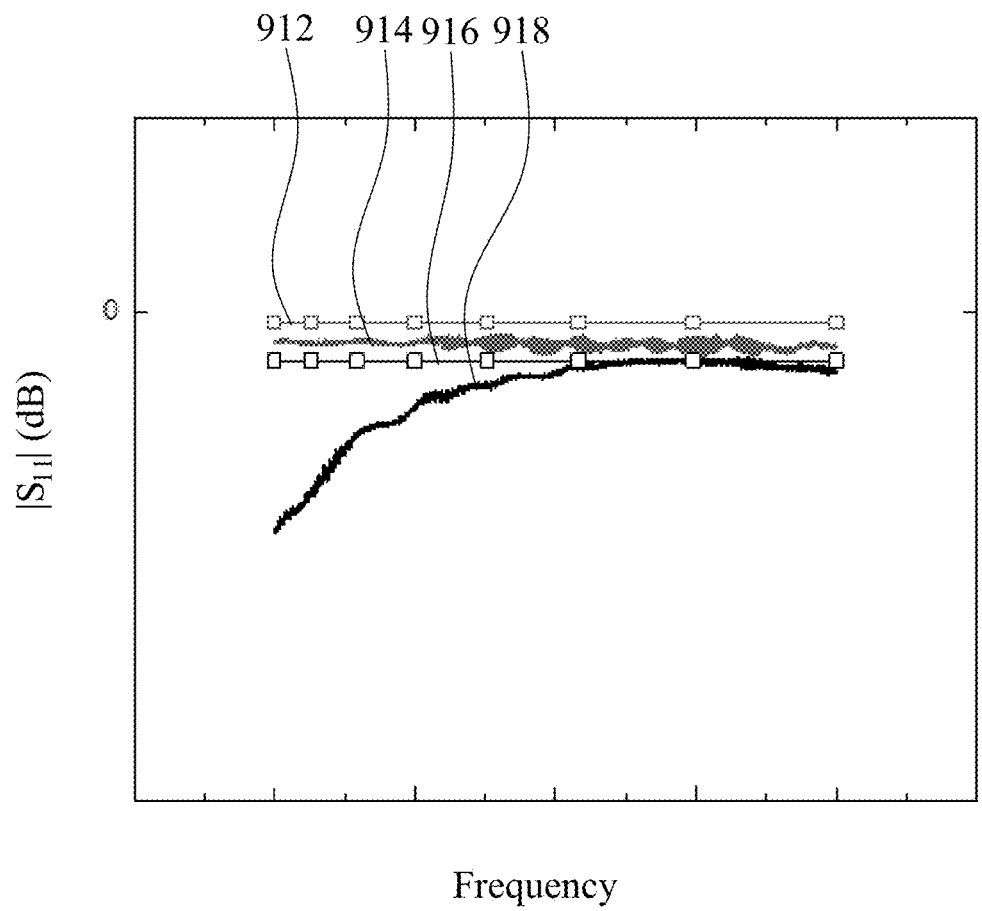
FIG. 21 illustrates simulation and measurement results of return loss of electronic devices with different thicknesses of the conductive resonators.

FIG. 21 illustrates simulation and measurement results of return losses $|S_{11}|$ of electronic devices with different thicknesses (e.g., the thickness T1 in FIG. 2A) of the conductive resonators. In FIG. 21, curve 912 represents a simulated return loss of an electronic device with a first thickness of the conductive resonator, curve 914 represents a measured return loss of an electronic device with the first thickness of the conductive resonator, curve 916 represents a simulated return loss of an electronic device with a second thickness of the conductive resonator, and curve 918 represents a measured return loss of an electronic device with the second thickness of the conductive resonator, where the first thickness is greater than the second thickness.

Figure 22A:
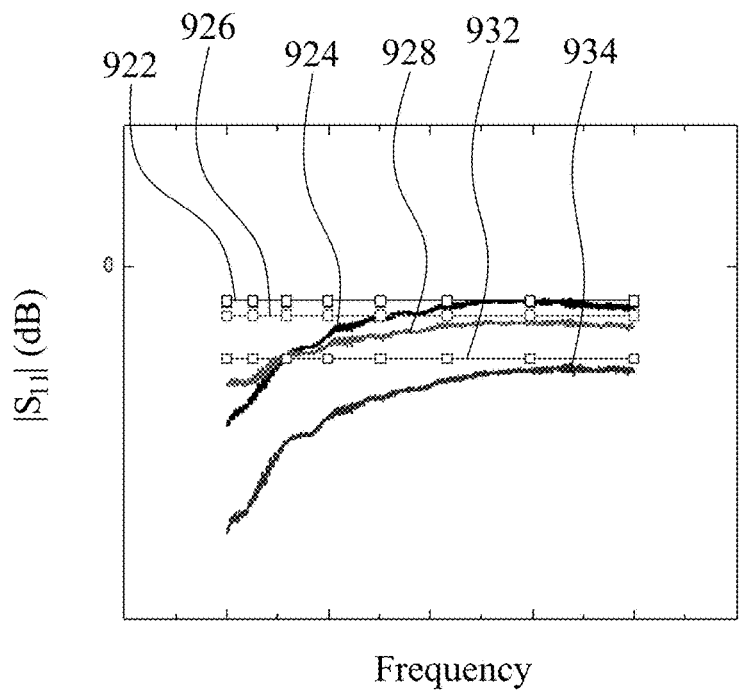
FIGS. 22A and 22B illustrate simulation and measurement results of return losses of electronic devices with different numbers of qubits and different thicknesses of the conductive resonators.
Figure 22B:
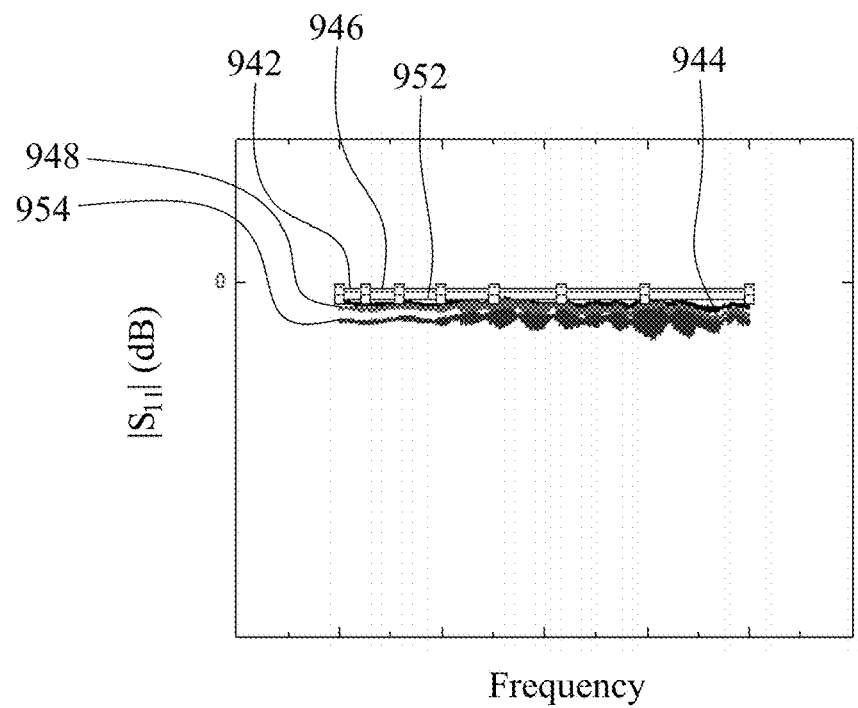

FIGS. 22A and 22B illustrate simulation and measurement results of return losses $|S_{11}|$ of electronic devices with different numbers of qubits and different thicknesses of the conductive resonators. In FIG. 22A, curve 922 represents a simulated return loss of an electronic device having a first number of qubits and with a third thickness of the conductive resonator, curve 924 represents a measured return loss of an electronic device having the first number of qubits and with the third thickness of the conductive resonator, curve 926 represents a simulated return loss of an electronic device having a second number of qubits and with the third thickness of the conductive resonator, curve 928 represents a measured return loss of an electronic device having the second number of qubits and with the third thickness of the conductive resonator, curve 932 represents a simulated return loss of an electronic device having a third number of qubits and with the third thickness of the conductive resonator, and curve 934 represents a measured return loss of an electronic device having the third number of qubits and with the third thickness of the conductive resonator, where the third number is greater than the second number, and the second number is greater than the first number. In FIG. 22B, curve 942 represents a simulated return loss of an electronic device having the first number of qubits and with a fourth thickness of the conductive resonator, curve 944 represents a measured return loss of an electronic device having the first number of qubits and with the fourth thickness of the conductive resonator, curve 946 represents a simulated return loss of an electronic device having the second number of qubits and with the fourth thickness of the conductive resonator, curve 948 represents a measured return loss of an electronic device having the second number of qubits and with the fourth thickness of the conductive resonator, curve 952 represents a simulated return loss of an electronic device having the third number of qubits and with the fourth thickness of the conductive resonator, and curve 954 represents a measured return loss of an electronic device having the third number of qubits and with the fourth thickness of the conductive resonator, where the fourth thickness is greater than the third thickness.

Figure 23A:
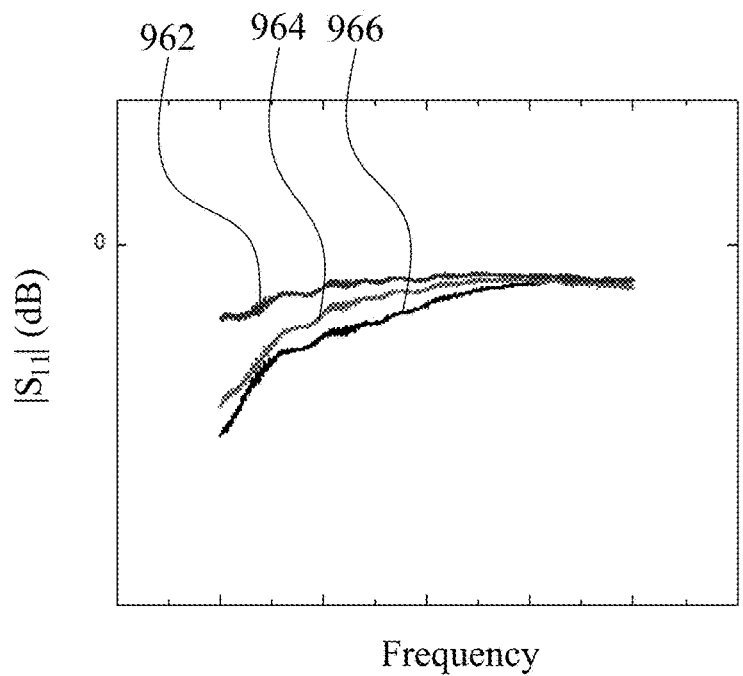
FIGS. 23A and 23B illustrate measurement results of return losses of electronic devices with different thicknesses and widths (e.g., the width W5 in FIG. 2A) of the conductive resonators.
Figure 23B:
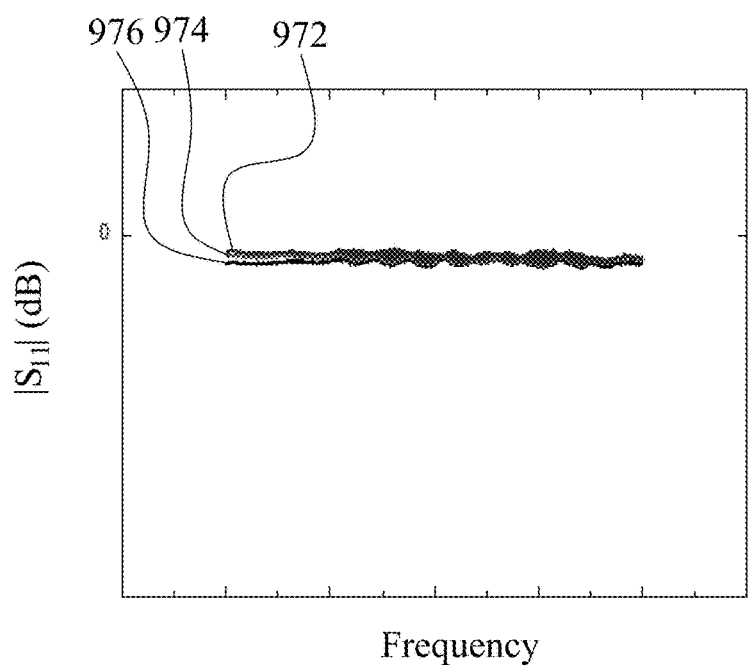

FIGS. 23A and 23B illustrate measurement results of return losses $|S_{11}|$ of electronic devices with different thicknesses and widths (e.g., the width W5 in FIG. 2A) of the conductive resonators. In FIG. 23A, curve 962 represents a measured return loss of an electronic device with a fifth thickness and a first width of the conductive resonator, curve 964 represents a measured return loss of an electronic device with the fifth thickness and a second width of the conductive resonator, and curve 966 represents a measured return loss of an electronic device with the fifth thickness and a third width of the conductive resonator, where the first width is greater than the second width, and the second width is greater than the third width. In FIG. 23B, curve 972 represents a measured return loss of an electronic device with a sixth thickness and the first width of the conductive resonator, curve 974 represents a measured return loss of an electronic device with the sixth thickness and the second width of the conductive resonator, and curve 976 represents a measured return loss of an electronic device with the sixth thickness and the third width of the conductive resonator, where the sixth thickness is greater than the fifth thickness.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the conductive resonator is able to generate strong magnetic fields and weak or negligible electric fields at the qubit location, such that the qubit generated in the qubit location has a high efficiency. Furthermore, adjacent qubits can share the conductive resonator to obtain high-qubit-density electronic devices. Moreover, the electronic devices have simple structures and may be integrated for an IC design and/or a PCB design.

According to some embodiments, an electronic device includes a pair of depletion gates, an accumulation gate, and a conductive resonator. The depletion gates are spaced apart from each other. The accumulation gate is over the depletion gates. The conductive resonator is over the depletion gates and the accumulation gate. The conductive resonator includes a first portion, a second portion, and a third portion. The first portion and the second portion are on opposite sides of the accumulation gate. The third portion interconnects the first and second portions of the conductive resonator and across the depletion gates. A bottom surface of the first portion of the conductive resonator is lower than a bottom surface of the accumulation gate.

According to some embodiments, an electronic device includes a pair of depletion gates, an accumulation gate, and a conductive resonator. The depletion gates are spaced apart from each other. The accumulation gate includes a first portion, a second portion, and a third portion. The first portion and the second portion are on opposite sides of the depletion gates. The third portion interconnects the first and second portions of the accumulation gate and is across the depletion gates. The conductive resonator includes a first portion, a second portion, and a third portion. The first portion and the second portion are on opposite sides of the depletion gates. The first portion of the accumulation gate is between the first portion of the conductive resonator and the depletion gates. The third portion interconnects the first and second portions of the conductive resonator.

According to some embodiments, a method includes forming a pair of depletion gates over a substrate. A first gate dielectric layer is deposited over the substrate to cover the pair of depletion gates. An accumulation gate is formed over the first gate dielectric layer. An isolation layer is deposited over the accumulation gate. An opening is formed in the isolation layer and extends into the first gate dielectric layer. A conductive resonator is partially formed in the opening of the isolation layer such that a bottom surface of the conductive resonator is lower than top surfaces of the depletion gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a pair of depletion gates over a semiconductor substrate;
   depositing a first gate dielectric layer over the semiconductor substrate to cover the pair of depletion gates;
   forming an accumulation gate over the first gate dielectric layer;
   depositing an isolation layer over the accumulation gate;
   forming an opening in the isolation layer and extending into the first gate dielectric layer; and
   forming a conductive resonator partially in the opening of the isolation layer such that a bottom surface of the conductive resonator is lower than top surfaces of the depletion gates.

2. The method of claim 1, further comprising forming a second gate dielectric layer over the semiconductor substrate prior to forming the pair of depletion gates.

3. The method of claim 2, wherein forming the opening in the isolation layer is such that the opening exposes the second gate dielectric layer.

4. The method of claim 1, further comprising forming a source region and a drain region in the semiconductor substrate prior to forming the pair of depletion gates.

5. The method of claim 1, wherein forming the conductive resonator comprises forming a portion of the conductive resonator outside the opening of the isolation layer.

6. The method of claim 1, wherein forming the conductive resonator is such that a portion of the conductive resonator outside the opening of the isolation layer is across the accumulation gate and the depletion gates.

7. The method of claim 1, wherein a portion of the conductive resonator in the opening extends in a direction substantially the same as an extending direction of the depletion gates.

8. A method comprising:
   forming a source region and a drain region in a substrate;
   forming a pair of depletion gates over the substrate;
   forming an accumulation gate over the depletion gates;
   forming a conductive resonator over the substrate, wherein the conductive resonator comprises:
   a first portion and a second portion on opposite sides of the accumulation gate; and
   a third portion interconnecting the first and second portions of the conductive resonator and across the depletion gates, wherein a top surface of the third portion of the conductive resonator is higher than a top surface of the first portion of the conductive resonator.

9. The method of claim 8, wherein the source region and the drain region are on opposite sides of the depletion gates in a top view.

10. The method of claim 8, wherein the first portion and the second portion of the conductive resonator extend in a direction substantially the same as an extending direction of the depletion gates.

11. The method of claim 8, wherein the accumulation gate has an H shape in a top view.

12. The method of claim 8, further comprising:
    forming an isolation layer to cover the accumulation gate prior to form the conductive resonator; and
    forming two openings in the isolation layer, wherein the first portion and the second portion of the conductive resonator are formed in the two openings, respectively.

13. The method of claim 8, further comprising:
    forming an isolation layer to cover the accumulation gate prior to form the conductive resonator;
    forming a first opening and a second opening in the isolation layer to expose the source region and the drain region, respectively; and
    forming a source contact in the first opening and a drain contact in the second opening after forming the conductive resonator.

14. The method of claim 8, wherein the source region and the first portion of the conductive resonator are on opposite sides of the third portion of the conductive resonator in a top view.

15. A method comprising:
    forming a source region and a drain region in a substrate;
    depositing a first gate dielectric layer to cover the source region and the drain region;
    forming a first depletion gate and a second depletion gate over the first gate dielectric layer;

depositing a second gate dielectric layer to cover the first depletion gate and the second depletion gate;

forming an accumulation gate over the second gate dielectric layer;

forming an isolation layer to cover the accumulation gate;

forming a first opening in the isolation layer and the second gate dielectric layer to expose the first gate dielectric layer, wherein a first portion of the accumulation gate is between the first depletion gate and the first opening; and forming a conductive resonator over the substrate, wherein a first portion of the conductive resonator fills in the first opening.

16. The method of claim 15, further comprising:

forming a second opening in the isolation layer and the second gate dielectric layer to expose the first gate dielectric layer, wherein a second portion of the accumulation gate is between the second depletion gate and the second opening, and a second portion of the conductive resonator fills in the second opening.

17. The method of claim 15, wherein a third portion of the conductive resonator is formed over the isolation layer.

18. The method of claim 17, wherein the third portion of the conductive resonator is across the accumulation gate.

19. The method of claim 17, wherein the third portion of the conductive resonator is across the first depletion gate and the second depletion gate.

20. The method of claim 15, wherein forming the accumulation gate is such that a third portion of the accumulation gate is across the first depletion gate.

\* \* \* \* \*